United States Patent
Hashimoto

(10) Patent No.: US 7,902,897 B2
(45) Date of Patent: Mar. 8, 2011

(54) VARIABLE DELAY CIRCUIT AND DELAY CORRECTION METHOD

(75) Inventor: Tetsutaro Hashimoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 53 days.

(21) Appl. No.: 12/190,363

(22) Filed: Aug. 12, 2008

(65) Prior Publication Data
US 2009/0045864 A1 Feb. 19, 2009

(30) Foreign Application Priority Data
Aug. 14, 2007 (JP) ................ 2007-211277

(51) Int. Cl.
*H03H 11/26* (2006.01)
(52) U.S. Cl. .................................. 327/262
(58) Field of Classification Search ........... 327/262
See application file for complete search history.

(56) References Cited

U.S. PATENT DOCUMENTS

| 5,719,514 | A | 2/1998 | Sato |
| 6,049,239 | A | 4/2000 | Eto et al. |
| 6,377,101 | B1 | 4/2002 | Eto et al. |
| 7,274,232 | B2 * | 9/2007 | Lin et al. ............. 327/158 |
| 2003/0034816 | A1 * | 2/2003 | Oh ....................... 327/162 |

FOREIGN PATENT DOCUMENTS

| JP | 09-015305 A | 1/1997 |
| JP | 09-018305 A | 1/1997 |
| JP | 2003-046378 A | 2/2003 |
| JP | 2006-092730 A | 4/2006 |
| JP | 2006-092730 A | 5/2006 |

* cited by examiner

*Primary Examiner* — Lincoln Donovan
*Assistant Examiner* — Daniel Rojas
(74) *Attorney, Agent, or Firm* — Arent Fox LLP

(57) ABSTRACT

A variable delay circuit is provided which has a plurality of delay elements. The variable delay circuit comprises a delay time correction circuit for individually correcting a delay time on each of the plurality of delay elements to compensate for the variation in transistor performance among the plurality of delay elements.

19 Claims, 18 Drawing Sheets

VARIABLE DELAY CIRCUIT AND DELAY CORRECTION METHOD

CROSS-REFERENCE TO RELATED APPLICATIONS

This application claims the benefit of priority from Japanese Patent Application No. 2007-211277 filed on Aug. 14, 2007, the entire contents of which are incorporated herein by reference.

BACKGROUND OF THE INVENTION

1. Field of the Invention

This application relates to a variable delay circuit and a semiconductor integrated circuit.

2. Description of Related Art

Techniques related to variable delay circuits are disclosed in Japanese Laid-open Patent Publication No. 2006-92730, Japanese Laid-open Patent Publication No. H9-18305, and Japanese Laid-open Patent Publication No. 2003-46378.

SUMMARY

According to one aspect of an embodiment, a variable delay circuit having a plurality of delay elements is provided, which comprises a delay time correction circuit that individually corrects a delay time in each of the plurality of delay elements to compensate for a variation in transistor performance among the plurality of delay elements.

Additional advantages and novel features of the invention will be set forth in part in the description that follows, and in part will become more apparent to those skilled in the art upon examination of the following or upon learning the various aspects of the invention.

DESCRIPTION OF PREFERRED EMBODIMENTS

Figure 1:
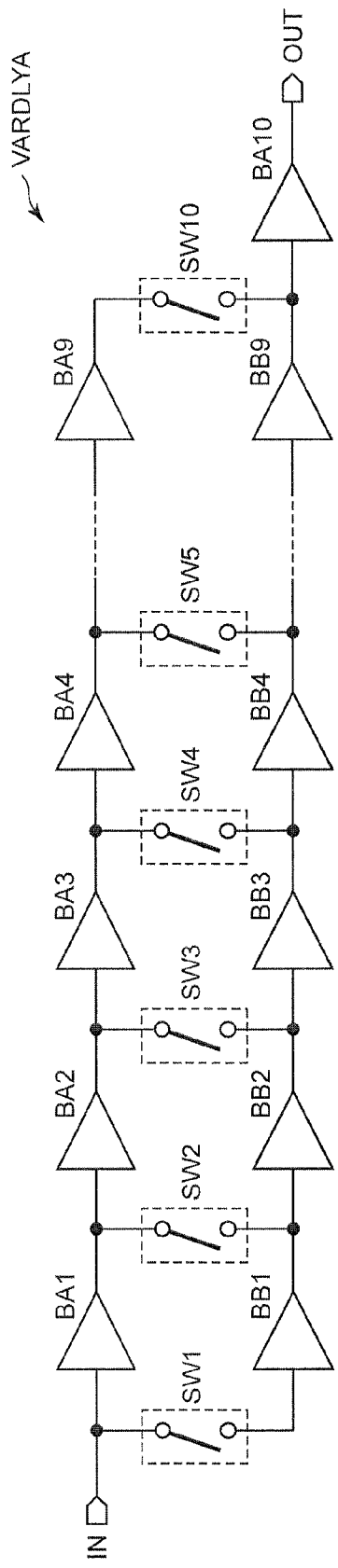
FIG. 1 shows a variable delay circuit.

FIG. 1 shows a variable delay circuit. A variable delay circuit VARDLYA includes delay elements BA1 to BA10 having a delay time $\tau f$, delay elements BB1 to BB9 having a delay time $\tau s$ ($\tau s > \tau f$), and switches SW1 to SW10. The delay elements BA1 to BA9 are coupled in series with an input terminal IN of the variable delay circuit VARDLYA. The delay elements BB1 to BB9 and BA10 are coupled in series to an output terminal OUT of the variable delay circuit VARDLYA. The switch SW1 is coupled between the input terminal IN of the variable delay circuit VARDLYA and an input terminal of the delay element BB1. The switch SW2 (SW3 to SW9) is coupled between an output terminal of the delay element BA1 (BA2 to BA8) and an input terminal of the delay element BB2 (BB3 to BB9). The switch SW10 is coupled between an output terminal of the delay element BA9 and an input terminal of the delay element BA10. The variable delay circuit VARDLYA controls the switches SW1 to SW10 so that one of the switches SW1 to SW10 is switched ON.

A minute difference in delay time ($\tau s - \tau f$) between the delay elements BA1 to BA10 and the delay elements BB1 to BB9A is delay time resolution, in the variable delay circuit VARDLYA. For example, if the delay time $\tau f$ of the delay elements BA1 to BA10 is 1.0 D (D is a unit time) and the delay time $\tau s$ of the delay elements BB1 to BB9 is 1.1 D, the delay time of the variable delay circuit VARDLYA is adjusted within a range between 10.0 D to 10.9 D in increments of 0.1 D.

Figure 2:
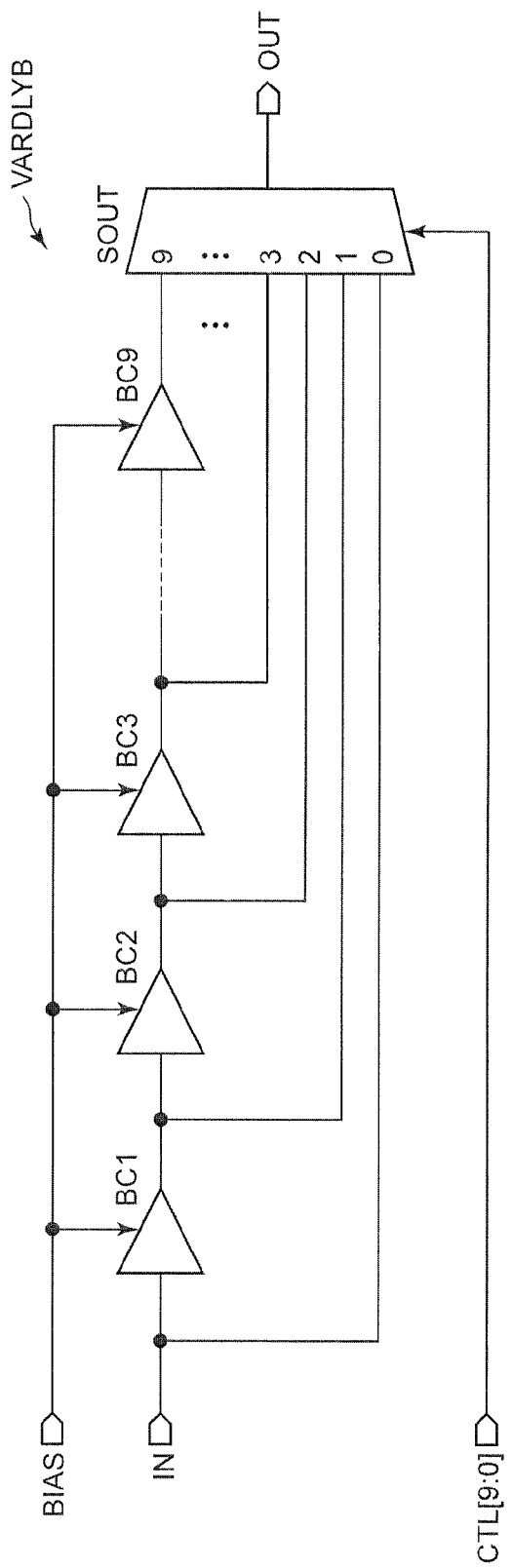
FIG. 2 shows a variable delay circuit.

FIG. 2 shows another variable delay circuit. A variable delay circuit VARDLYB includes delay elements BC1 to BC9 and a selector SOUT. The delay elements BC1 to BC9 are coupled in series with an input terminal IN of the variable delay circuit VARDLYB. The delay elements BC1 to BC9 are voltage control delay elements, delay times of which vary depending on voltages supplied from a bias terminal BIAS of the variable delay circuit VARDLYB. If a signal supplied from a control terminal CTL[0] among control terminals CTL[9:0] of the variable delay circuit VARDLYB is 1, the selector SOUT selects one signal out of a plurality of signals supplied from the input terminal IN of the variable delay circuit VARDLYB and outputs the signal to an output terminal OUT of the variable delay circuit VARDLYB. If a signal supplied from the control terminal CTL[1] (CTL[2] to CTL[9]) among the control terminals CTL[9:0] is 1, the selector SOUT selects one signal out of a plurality of signals supplied from the delay elements BC1 (BC2 to BC9) and outputs the signal to the output terminal OUT of the variable delay circuit VARDLYB.

The variable delay circuit VARDLYB in FIG. 2, roughly adjusts the delay time (a rough delay adjustment) by switching the signals supplied to the output terminal OUT by the selector SOUT based on the signal supplied from the control terminals CTL[9:0]. The variable delay circuit VARDLYB finely adjusts the delay time (a fine delay adjustment) by controlling the delay times of the delay elements BC1 to BC9 based on signals supplied from the bias terminal BIAS. Since the variable delay circuit VARDLYB adjusts the delay times of the delay elements BC1 to BC9 in a lump with the fine delay adjustment, delay time resolution of the variable delay circuit VARDLYB is rougher than the delay time resolution of the variable delay circuit VARDLYA in FIG. 1.

A delay time of a delay element intended by designers (an ideal delay time) may be set, in the variable delay circuit having a high resolution such as the variable delay circuit VARDLYA in FIG. 1. However, it may occur that the delay time of the delay element dose not coincide with the ideal delay time due to changes in operating environment (such as temperature and power supply voltage) of a semiconductor integrated circuit including the variable delay circuit or due to influences of manufacturing variations in transistor performance. For the above reasons, a function to correct the delay time of the delay element in the variable delay element is necessary.

Figure 3:
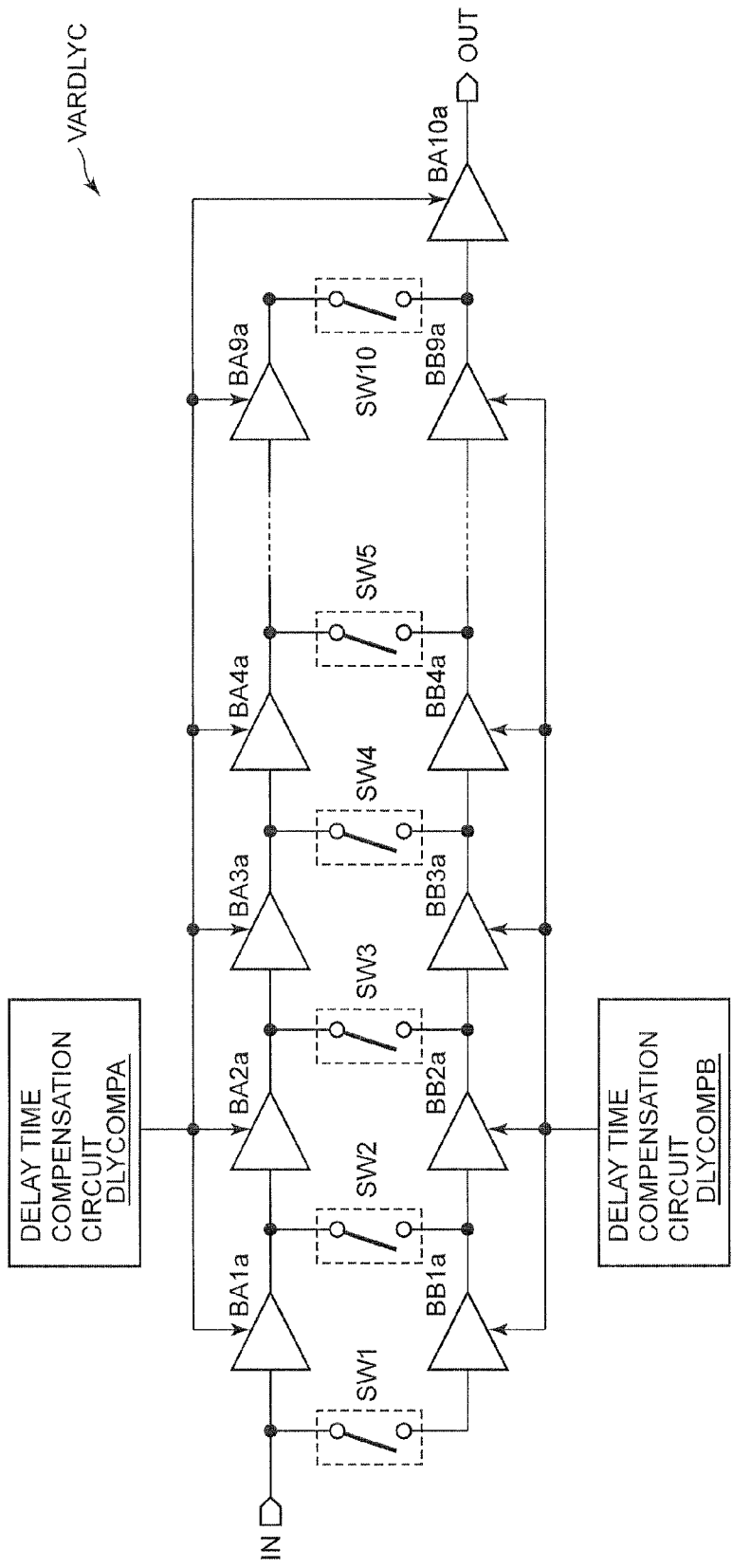
FIG. 3 shows a variable delay circuit.

FIG. 3 shows yet another variable delay circuit. The delay elements BA1 to BA10 and BB1 to BB9 in the variable delay circuit VARDLYA in FIG. 1 are replaced with delay elements BA1a to BA10a and BB1a to BB9a, respectively, in a variable delay circuit VARDLYC. Furthermore, the variable delay circuit VARDLYC includes delay time compensation circuits DLYCOMPA and DLYCOMPB. The delay elements BA1a to BA10a (BB1a to BB9a) are the voltage control delay elements, the delay times of which vary depending on voltages supplied from the delay time compensation circuit DLYCOMPA (DLYCOMPB). The delay time compensation circuit DLYCOMPA (DLYCOMPB) includes a delay circuit having the same voltage control delay element as the delay elements BA1a to BA10a (BB1a to BB9a). The delay time compensation circuit DLYCOMPA (DLYCOMPB) adjusts a bias voltage of the voltage control delay element of the delay circuit so that the delay times of the entire delay circuit coincides with a cycle of a reference clock signal. The delay time compensation circuit DLYCOMPA (DLYCOMPB) corrects the delay times of the delay elements BA1a to BA10a (BB1a to BB9a) by supplying the delay elements BA1a to BA10a (BB1a to BB9a) with the bias voltage of the voltage control delay element of the delay circuit.

The manufacturing variations in the transistor performance include manufacturing variations among chips and manufacturing variations in a chip. The manufacturing variations among chips are the variations in transistor performance among the semiconductor integrated circuits manufactured by using the same mask pattern. The manufacturing variations in the chip are the variations in transistor performance among transistors within a semiconductor integrated circuit made up of tens of millions of transistors.

The variable delay circuit having the high resolution adjusts the delay time of the high resolution by using a minute difference in delay time among the delay elements. The manufacturing variations in the chip for the transistor performance influence on the lengths of the delay times among the delay elements and this results in deterioration in delay time precision of the variable delay circuit. The variable delay circuit in FIG. 3 uniformly adjusts the delay times of the plurality of delay elements within the variable delay circuit. Therefore, the variable delay circuit compensates for the manufacturing variations among chips, but does not compensate for the manufacturing variations in the chip.

Figure 4:
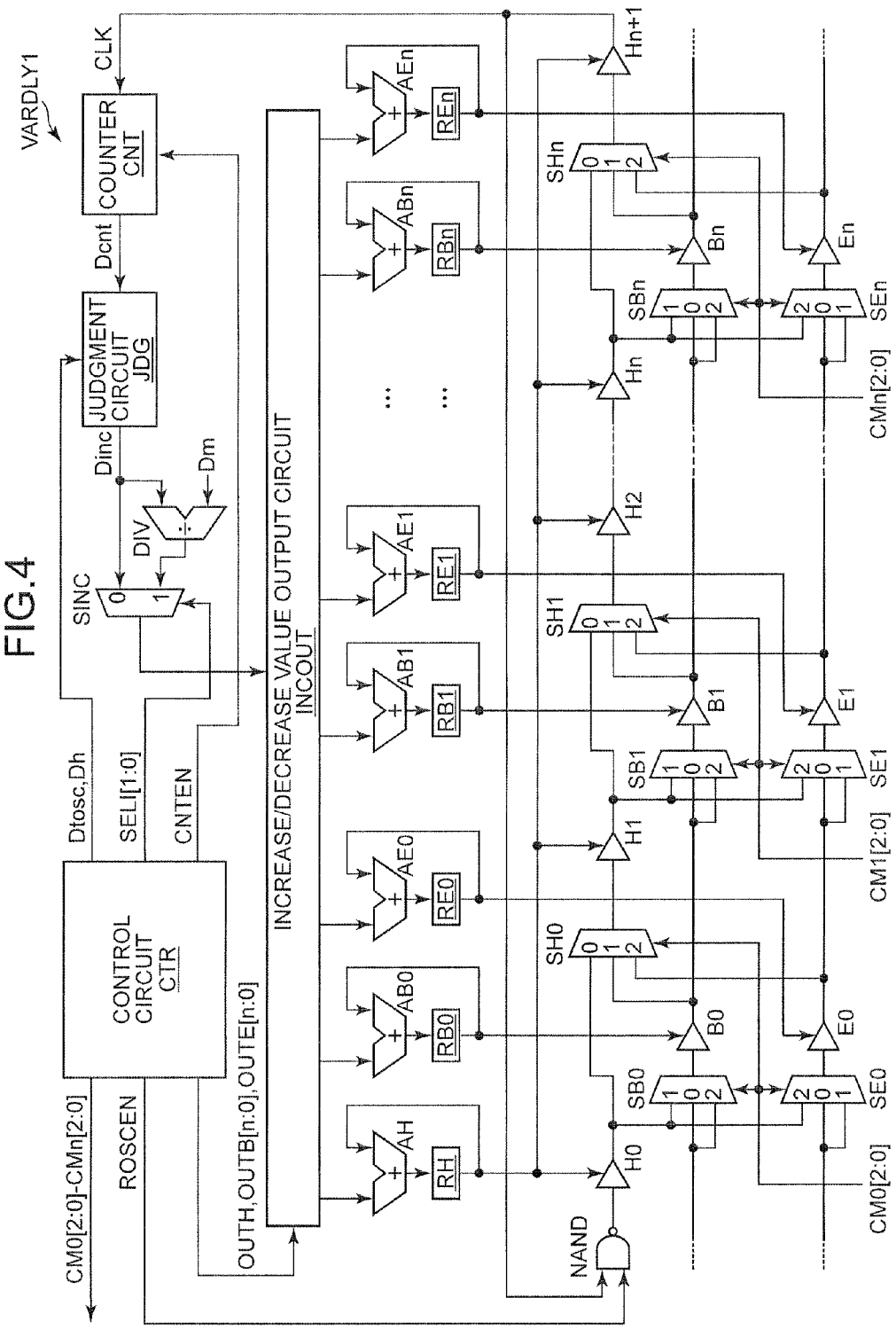
FIG. 4 shows a first embodiment.

FIG. 4 shows a first embodiment. FIGS. 5 through 11 show the variable delay elements in FIG. 4. FIG. 12 shows a judgment circuit in FIG. 4. A variable delay circuit VARDLY1 provided on a very large scale integration (VLSI) according to the first embodiment includes selectors SB0 to SBn, SE0 to SEn, SH0 to SHn and SINC, delay elements B0 to Bn, E0 to En and H0 to Hn+1, a gate circuit NAND, a counter CNT, a judgment circuit JDG, a divider DIV, an increase/decrease value output circuit INCOUT, adders AB0 to ABn, AE0 to AEn and AH, registers RB0 to RBn, RE0 to REn and RH, and a control circuit CTR.

If any one of selector control signals CM0[0] and CM0[2] among selector control signals CM0[2:0] supplied from the control circuit CTR is "1", the selector SB0 outputs a signal supplied from an input terminal of the variable delay circuit VARDLY1. If a selector control signal CM0[1] among the selector control signals CM0[2:0] is "1", the selector SB0 outputs an output signal of the delay element H0. If any one of selector control signals CM1[0] (CM2[0] to CMn[0]) and CM1[2] (CM2[2] to CMn[2]) among selector control signals CM1[2:0] (CM2[2:0] to CMn[2:0]) supplied from the control circuit CTR is "1", the selector SB1 (SB2 to SBn) outputs an output signal of a delay element B0 (B1 to Bn−1). If a selector control signal CM1[1] (CM2[1] to CMn[1]) among the selector control signals CM1[2:0] (CM2[2:0] to CMn[2:0]) is "1", the selector SB1 (SB2 to SBn) outputs an output signal of delay element H1 (H2 to Hn). The delay element B0 (B1 to Bn) outputs on receiving the output signal of the selector SB0 (SB1 to SBn). The delay element B0 (B1 to Bn) is a variable delay element, the delay time of which varies depending on values in the register RB0 (RB1 to RBn).

If any one of the selector control signals CM0[0] and CM0[1] among the selector control signals CM0[2:0] supplied from the control circuit CTR is "1", the selector SE0 outputs the signal supplied via a switch from an input terminal of the variable delay circuit VARDLY1. If the selector control signal CM0[2] among the selector control signals CM0[2:0] is "1", the selector SE0 outputs the output signal of the delay element H0. If any one of the selector control signals CM1[0] (CM2[0] to CMn[0]) and CM1[1] (CM2[1] to CMn[1]) among the selector control signals CM1[2:0] supplied from the control circuit CTR is "1", the selector SE1 (SE2 to SEn) outputs an output signal of the delay element E0 (E1 to En−1). If the selector control signal CM1[2] (CM2[2] to CMn[2]) among the selector control signals CM1[2:0] is "1", the selector SE1 (SE2 to SEn) outputs the output signal of the delay element H1 (H2 to Hn). The delay element E0 (E1 to En) outputs on receiving the output signal of the selector SE0 (SE1 to SEn). The delay element E0 (E1 to En) is the variable delay element, the delay time of which varies depending on values in the register RE0 (RE1 to REn).

If the selector control signal CM0[0] (CM1[0] to CMn[0]) among the selector control signals CM0[2:0] (CM1[2:0] to CMn[2:0]) supplied from the control circuit CTR is "1", the selector SH0 (SH1 to SHn) outputs the output signal of the delay element H0 (H1 to Hn). If the selector control signal CM0[1] (CM1[1] to CMn[1]) among the selector control signals CM0[2:0] (CM1[2:0] to CMn[2:0]) is "1", the selector SH0 (SH1 to SHn) outputs the output signal of the delay element B0 (B1 to Bn). If the selector control signal CM0[2] (CM1[2] to CMn[2]) among the selector control signals CM0[2:0] (CM1[2:0] to CMn[2:0]) is "1", the selector SH0 (SH1 to SHn) outputs the output signal of the delay element E0 (E1 to En). The delay element H0 outputs on receiving an output signal of the gate circuit NAND. The delay element H1 (H2 to Hn+1) outputs on receiving the output signal of the selector SH0 (SH1 to SHn). The delay elements H0 to Hn+1 are the variable delay elements, the delay times of which vary depending on values in register RH. If a ring oscillator control signal ROSCEN is "0", the gate circuit NAND outputs an output signal "1". If the ring oscillator control signal ROSCEN is "1", the gate circuit NAND inverts an output signal of the delay element Hn+1 and outputs the output signal.

For example, any of variable delay elements DLY1 to DLY7 shown in FIGS. 5 through 11 is used as the delay elements B0 to Bn, E0 to En and H0 to Hn+1 of the variable delay circuit VARDLY1. The variable delay element DLY1 shown in FIG. 5A includes PMOS transistors TP10, TP11 and SP10 to SP1p, NMOS transistors TN10, TN11 and SN10 to SN1p, and inverters INV10 to INV1p. A source of the PMOS transistor TP10 and a source of the PMOS transistor TP11 are coupled with each other. A drain of the PMOS transistor TP10 and a drain of the NMOS transistor TN10 are coupled with each other. A drain of the PMOS transistor TP11 and a drain of the NMOS transistor TN11 are coupled with each other. A source of NMOS transistor TN10 and a source of the NMOS transistor TN11 are coupled with each other. A gate of the PMOS transistor TP10 and a gate of the NMOS transistor TN10 are coupled to an input terminal IN of the variable delay element DLY1. A gate of the PMOS transistor TP11 and a gate of the NMOS transistor TN11 are coupled to a connection node between the PMOS transistor TP10 and the NMOS transistor TN10. A connection node between the PMOS transistor TP11 and the NMOS transistor TN11 is coupled to an output terminal OUT of the variable delay element DLY1.

Sources of the PMOS transistors SP10 to SP1p are coupled to a power supply line VDD. Drains of the PMOS transistors SP10 to SP1p are coupled to a connection node between the PMOS transistors TP10 and TP11. Gates of the PMOS transistors SP10 to SP1p are coupled via inverters INV10 to INV1p to control terminals CTL[0] to CTL[p] of the variable delay element DLY1. Sources of the NMOS transistors SN10 to SN1p are coupled to a ground line VSS. Drains of the NMOS transistors SN10 to SN1p are coupled to a connection node between the NMOS transistors TN10 and TN11. Gates of the NMOS transistors SN10 to SN1p are coupled to the control terminals CTL[0] to CTL[p] of the variable delay element DLY1. A delay time of the variable delay element DLY1 in FIG. 5 is adjusted by controlling the number of the PMOS transistors in their ON states among the PMOS transistors SP10 to SP1p and the number of the NMOS transistors in their ON states among the NMOS transistors SN10 to SN1p.

Figure 5A:
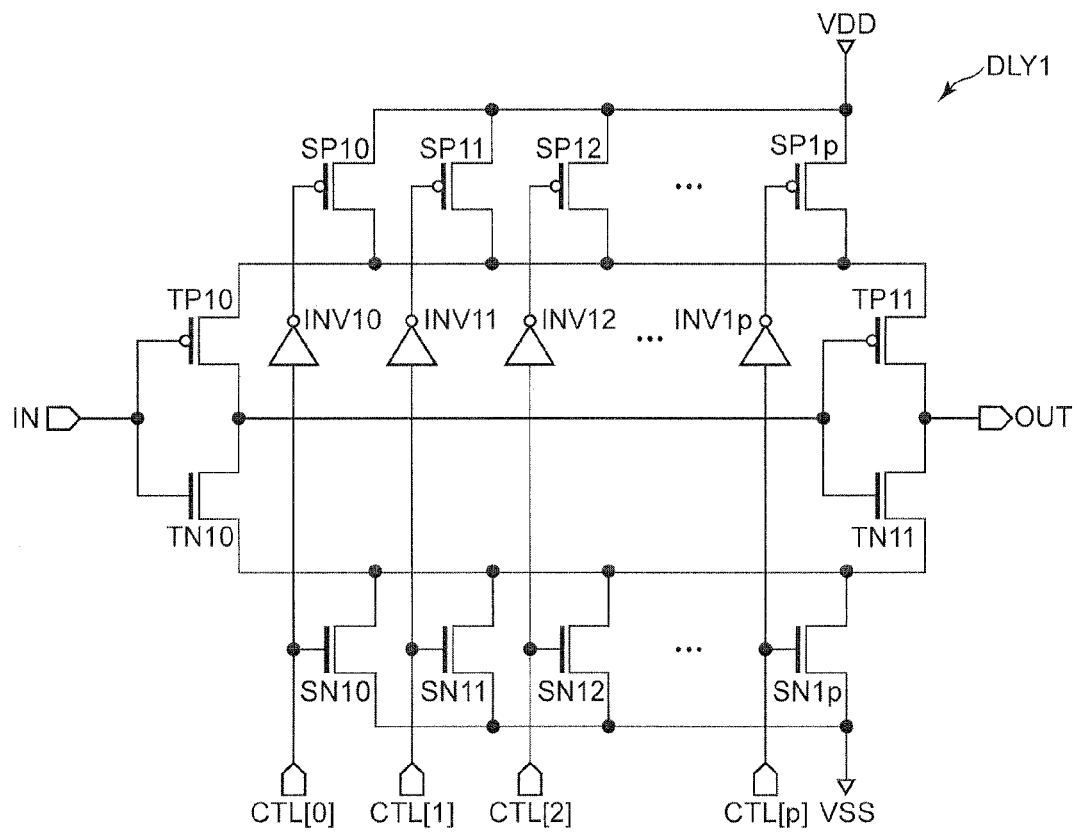
FIG. 5 shows a variable delay element in the first embodiment.
Figure 5B:
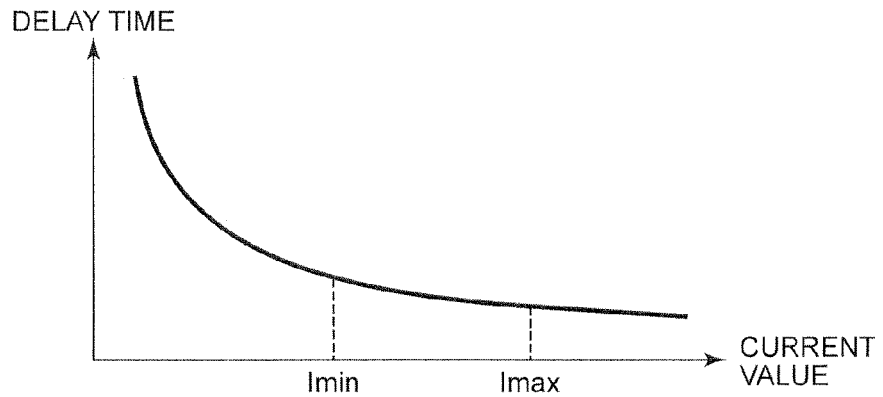

The variable delay element DLY1 makes use of a part where a delay time-current value characteristic line varies lineally as shown in FIG. 5B. If the number of PMOS transistors in their ON states among the PMOS transistors SP10 to SP1p and the number of NMOS transistors in their ON states among the NMOS transistors SN10 to SN1p is 1, a current value of the variable delay element DLY1 becomes Imin. If the number of PMOS transistors in their ON states among the PMOS transistors SP10 to SP1p and the number of NMOS transistors in their ON states among the NMOS transistors SN10 to SN1p is (p+1), the current value of the variable delay element DLY1 becomes Imax.

Figure 6:
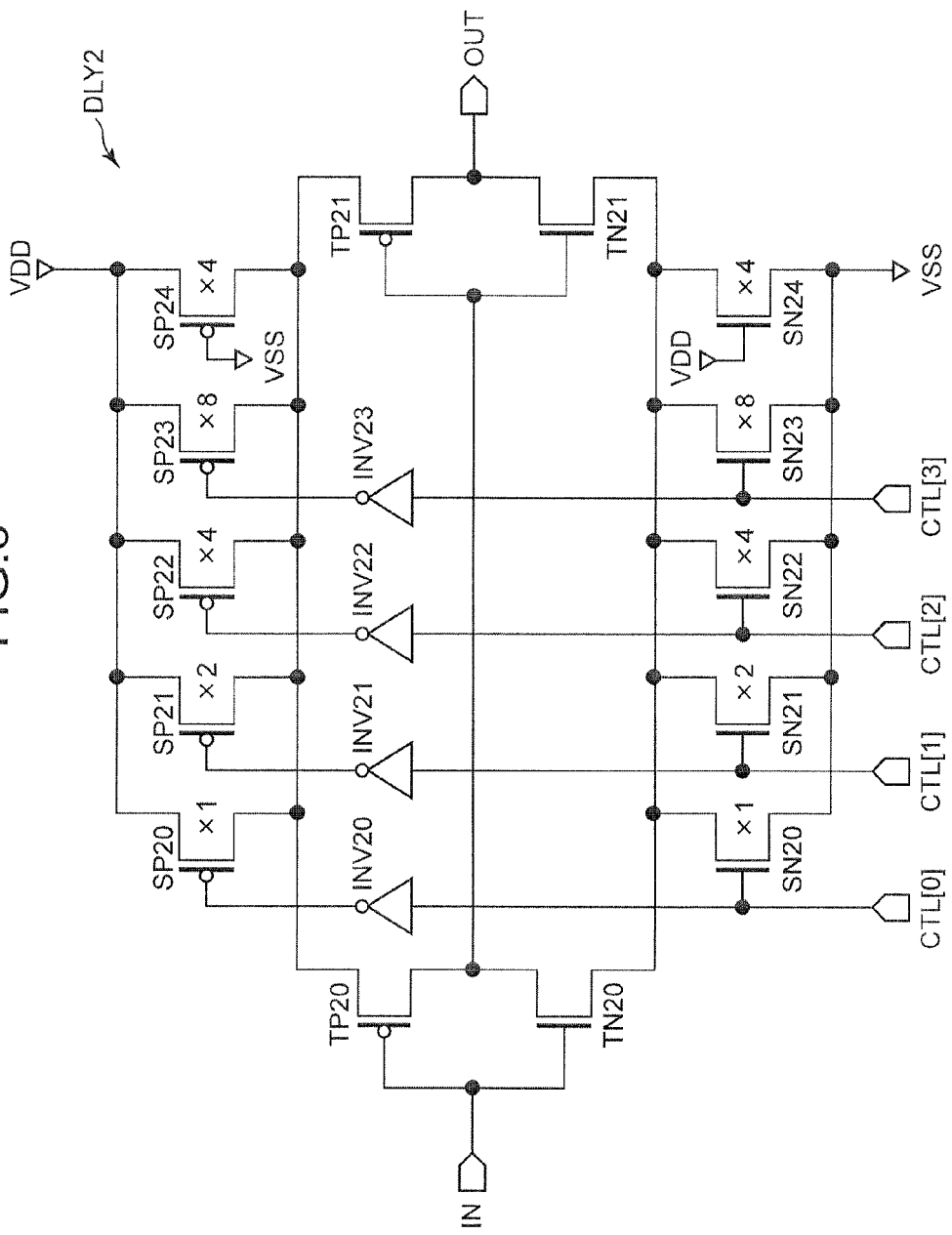
FIG. 6 shows a variable delay element according to the first embodiment.

A variable delay element DLY2 shown in FIG. 6 includes PMOS transistors TP20, TP21 and SP20 to SP24, NMOS transistors TN20, TN21 and SN20 to SN24, and inverters INV20 to INV23. A source of the PMOS transistor TP20 and a source of the PMOS transistor TP21 are coupled with each other. A drain of the PMOS transistor TP20 and a drain of the NMOS transistor TN20 are coupled with each other. A drain of the PMOS transistor TP21 and a drain of the NMOS transistor TN21 are coupled with each other. A source of the NMOS transistor TN20 and a source of the NMOS transistor TN21 are coupled with each other. A gate of the PMOS transistor TP20 and a gate of the NMOS transistor TN20 are coupled to an input terminal IN of the variable delay element DLY2. A gate of the PMOS transistor TP21 and a gate of the NMOS transistor TN21 are coupled to a connection node between the PMOS transistor TP20 and the NMOS transistor TN20. A connection node between the PMOS transistor TP21 and NMOS transistor TN21 is coupled to an output terminal OUT of the variable delay element DLY2.

Sources of the PMOS transistors SP20 to SP24 are coupled to the power supply line VDD. Drains of the PMOS transistors SP20 to SP24 are coupled to a connection node between the PMOS transistors TP20 to TP21. Gates of the PMOS transistors SP20 to SP23 are coupled to control terminals CTL[0] to CTL[3] of the variable delay element DLY2 via the inverters INV20 to INV23. A gate of the PMOS transistor SP24 is coupled to the ground line VSS. A transistor size of the PMOS transistor SP21 is twice as large as that of the PMOS transistor SP20. Transistor sizes of the PMOS transistors SP22 and SP24 are four times as large as that of the PMOS transistor SP20. A transistor size of the PMOS transistor SP23 is eight times as large as that of the PMOS transistor SP20.

Sources of the NMOS transistors SN20 to SN24 are coupled to the ground line VSS. Drains of the NMOS transistors SN20 to SN24 are coupled to a connection node between NMOS transistors TN20 and TN21. Gates of the NMOS transistor SN20 to SN23 are coupled to the control terminals CTL[0] to CTL[3] of the variable delay element DLY2. A gate of the NMOS transistor SN24 is coupled to the power supply line VDD. A transistor size of the NMOS transistor SN21 is twice as large as that of the NMOS transistor SN20. Transistor sizes of the NMOS transistors SN22 and SN24 are four times as large as that of the NMOS transistor SN20. A transistor size of the NMOS transistor SN23 is eight times as large as that of the NMOS transistor SN20. A delay time of the variable delay element DLY2 in FIG. 6 is adjusted by controlling the number of the PMOS transistors in their ON states among the PMOS transistors SP20 to SP23 and the number of the NMOS transistors in their ON states among NMOS transistors SN20 to SN23.

Figure 7A:
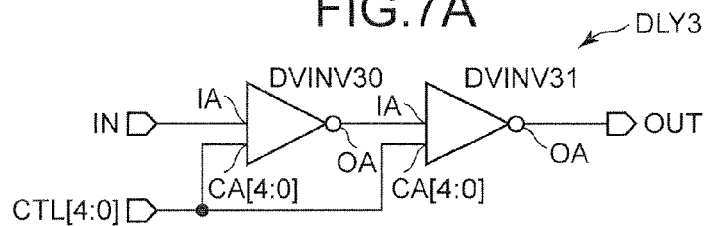
FIG. 7 shows a variable delay element the first embodiment.

A variable delay element DLY3 in FIG. 7A includes drive capability variable inverters DVINV30 and DVINV31. An input terminal IA of the drive capability variable inverter DVINV30 is coupled to an input terminal IN of the variable delay element DLY3. An output terminal OA of the drive capability variable inverter DVINV 30 is coupled to an input terminal IA of the drive capability variable inverter DVINV 31. An output terminal OA of the drive capability variable inverter DVINV31 is coupled to an output terminal OUT of the variable delay element DLY3. Control terminals CA[4:0] of the derive capability variable inverters DVINV30 and DVINV31 are coupled to control terminals CTL[4:0] of the variable delay element DLY3.

Figure 7B:
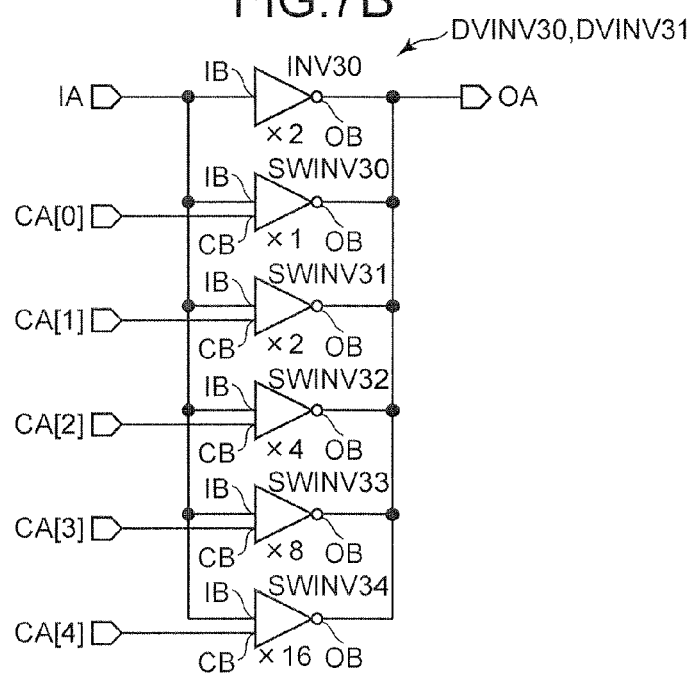

As shown in FIG. 7B, the drive capability variable inverter DVINV30 (DVINV31) includes an inverter INV30 and inverters having a control terminal SWINV30 to SWINV34. Input terminals IB of the inverter INV30 and the inverters having the control terminals SWINV30 to SWINV34 are coupled to an input terminal IA of the drive capability variable inverter DVINV30 (DVINV31). Output terminals OB of the inverter 30 and the inverters having the control terminals SWINV30 to SWINV34 are coupled to an output terminal OA of the drive capability variable inverter DVINV30 (DVINV31). Control terminals CB of the inverters having control terminals SWINV30 to SWINV34 are coupled to control terminals CA[0] to CA[4] of the drive capability variable inverter DVINV30 (DVINV31). A drive capability (the transistor sizes of the transistors forming the inverter) of the inverter having the control terminal SWINV31 is twice as large as that of the inverter having the control terminal SWINV30. A drive capability of the inverter having the control terminal SWINV32 is four times as large as that of the inverter having the control terminal SWINV30. A drive capability of the inverter having the control terminal SWINV33 is eight times as large as that of the inverter having the control terminal SWINV30. A drive capability of the inverter having the control terminal SWINV34 is sixteen times as large as that of the inverter having the control terminal SWINV30. A drive capability of the inverter INV30 is twice as large as that of the inverter having the control terminal SWINV30.

Figure 7C:
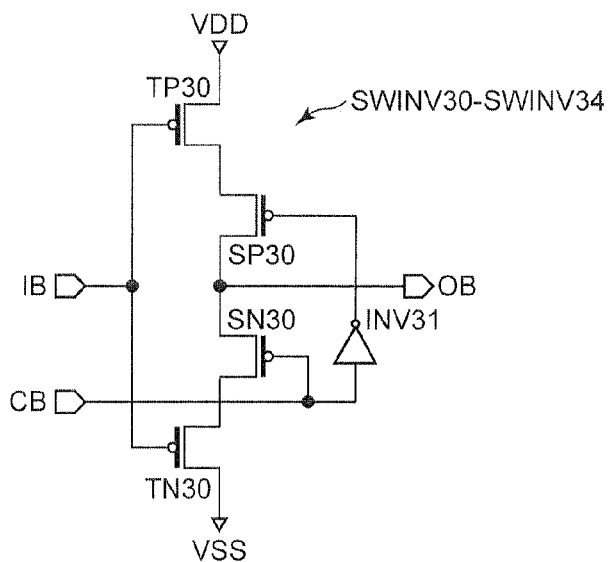

As shown in FIG. 7C, the inverter having the control terminal SWINV30 (SWINV31 to SWINV34) includes PMOS transistors TP30 and SP30, NMOS transistors TN30 and SN30, and inverter INV31. A source of the PMOS transistor TP30 is coupled to the power supply line VDD. A drain of the PMOS transistor TP30 and a source of the PMOS transistor SP30 are coupled with each other. A drain of the PMOS transistor SP30 and a drain of the NMOS transistor SN30 are coupled with each other. A source of the NMOS transistor SN30 and a drain of the NMOS transistor TN30 are coupled with each other. A source of the NMOS transistor TN30 is coupled to the ground line VSS. A gate of the PMOS transistor TP30 and a gate of the NMOS transistor TN30 are coupled to an input terminal IB of the inverter having the control terminal SWINV30 (SWINV31 to SWINV34). A gate of the PMOS transistor SP30 is coupled via the inverter INV31 to the control terminal CB of the inverter having the control terminal SWINV30 (SWINV31 to SWINV34). A gate of the NMOS transistor TN30 is coupled to the control terminal CB of the inverter having the control terminal SWINV30 (SWINV31 to SWINV34). A connection node between the PMOS transistor SP30 and the NMOS transistor SN30 is coupled to the output terminal OB of the inverter having the control terminal SWINV30 (SWINV31 to SWINV34). A delay time of the variable delay element DLY3 in FIG. 7A is adjusted by controlling the number of the inverters having the control terminals in their ON states among the inverters having the control terminals SWINV30 to SWINV34 of the drive capability variable inverters DVINV30 and DVINV31.

Figure 8A:
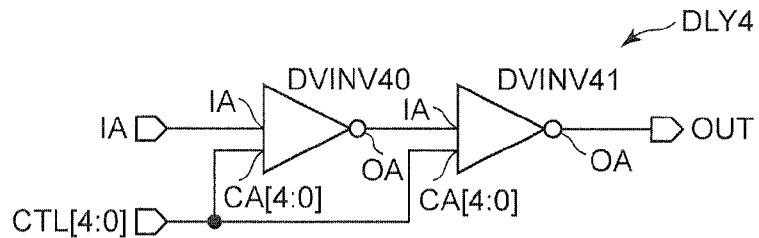
FIG. 8 shows a variable delay element the first embodiment.

A variable delay element DLY4 shown in FIG. 8A includes drive capability variable inverters DVINV40 and DVINV41. An input terminal IA of the drive capability variable inverter DVINV 40 is coupled to an input terminal IN of the variable delay element DLY4. An output terminal OA of the drive capability variable inverter DVINV40 is coupled to an input terminal IA of the drive capability variable inverter DVINV41. An output terminal OA of the drive capability variable inverter DVINV41 is coupled to an output terminal OUT of the variable delay element DLY3. Control terminals CA[4:0] of the drive capability variable inverter DVINV40 and DVINV41 are coupled to the control terminals CTL[4:0] of the variable delay element DLY4.

Figure 8B:
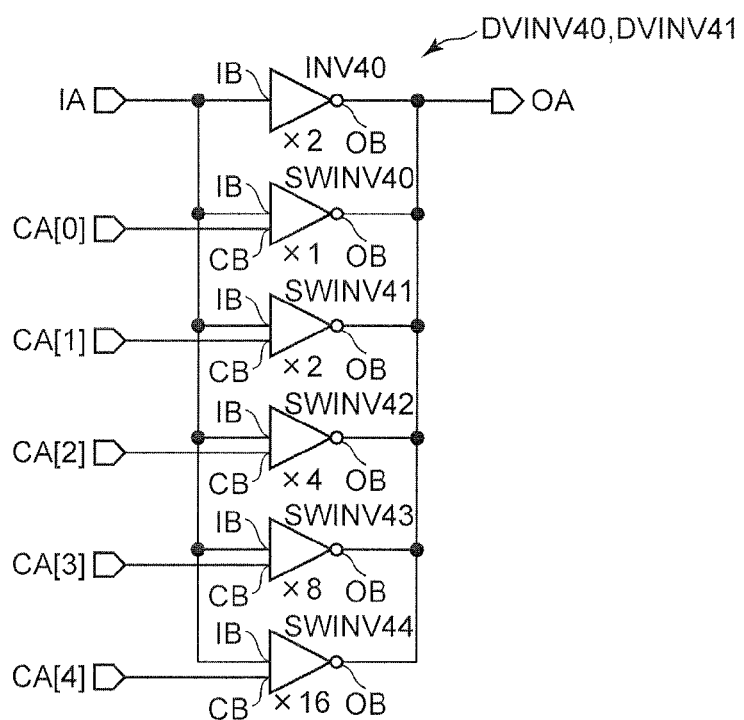

As shown in FIG. 8B, the drive capability variable inverter DVINV40 (DVINV41) includes an inverter INV40 and an inverter having control terminals SWINV40 to SWINV44. Input terminals IB of the inverter INV40 and the inverters having the control terminals SWINV40 to SWINV44 are coupled to an input terminal IA of the drive capability variable inverter DVINV40 (DVINV41). Output terminals OB of the inverter 40 and the inverters having the control terminals SWINV40 to SWINV44 are coupled to an output terminal OA of the drive capability variable inverter DVINV40 (DVINV41). Control terminals CB of the inverters having the control terminals SWINV40 to SWINV44 are coupled to control terminals CA[0] to CA[4] of the drive capability variable inverter DVINV40 (DVINV44). A drive capability of the inverter having the control terminal SWINV41 is twice as large as that of the inverter having the control terminal SWINV40. A drive capability of the inverter having the control terminal SWINV42 is four times as large as that of the inverter having the control terminal SWINV40. A drive capability of the inverter having the control terminal SWINV43 is eight times as large as that of the inverter having the control terminal SWINV40. A drive capability of the inverter having the control terminal SWINV44 is sixteen times as large as that of the inverter having the control terminal SWINV40. A drive capability of the inverter INV40 is twice as large as that of the inverter having the control terminal SWINV40.

Figure 8C:
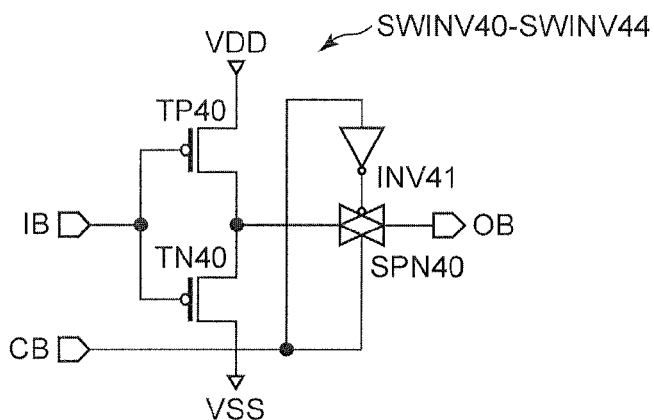

As shown in FIG. 8C, the inverter having the control terminal SWINV40 (SWINV41 to SWINV44) includes a PMOS transistor TP40, an NMOS transistor TN40, a CMOS switch SPN40, and an inverter INV 41. A drain of the PMOS transistor TP40 is coupled to the power supply line VDD. A drain of the PMOS transistor TP40 and a drain of the NMOS transistor TN40 are coupled with each other. A gate of the PMOS transistor TP40 and a gate of the NMOS transistor TN40 are coupled to an input terminal IB of the inverter having the control terminal SWINV40 (SWINV41 to SWINV44). The CMOS switch SPN40 is coupled between a connection node of the PMOS transistor TP40 and the NMOS transistor TN40 and an output terminal OB of the inverter having the control terminal SWINV40 (SWINV41 to SWINV44). A gate of a PMOS transistor of the CMOS switch SPN40 is coupled via the inverter INV41 to a control terminal CB of the inverter having the control terminal SWINV40 (SWINV41 to SWINV44). A gate of an NMOS transistor of the CMOS switch SPN40 is coupled to the control terminal CB of the inverter having the control terminal SWINV40 (SWINV41 to SWINV44). Like the variable delay element DLY3 shown in FIG. 7A, a delay time of the variable delay element DLY4 shown in FIG. 8A is adjusted by controlling the number of the inverters having the control terminals in their ON states among the inverters having the control terminals SWINV40 to SWINV44 of the drive capability variable inverters DVINV40 and DVINV41.

Figure 9A:
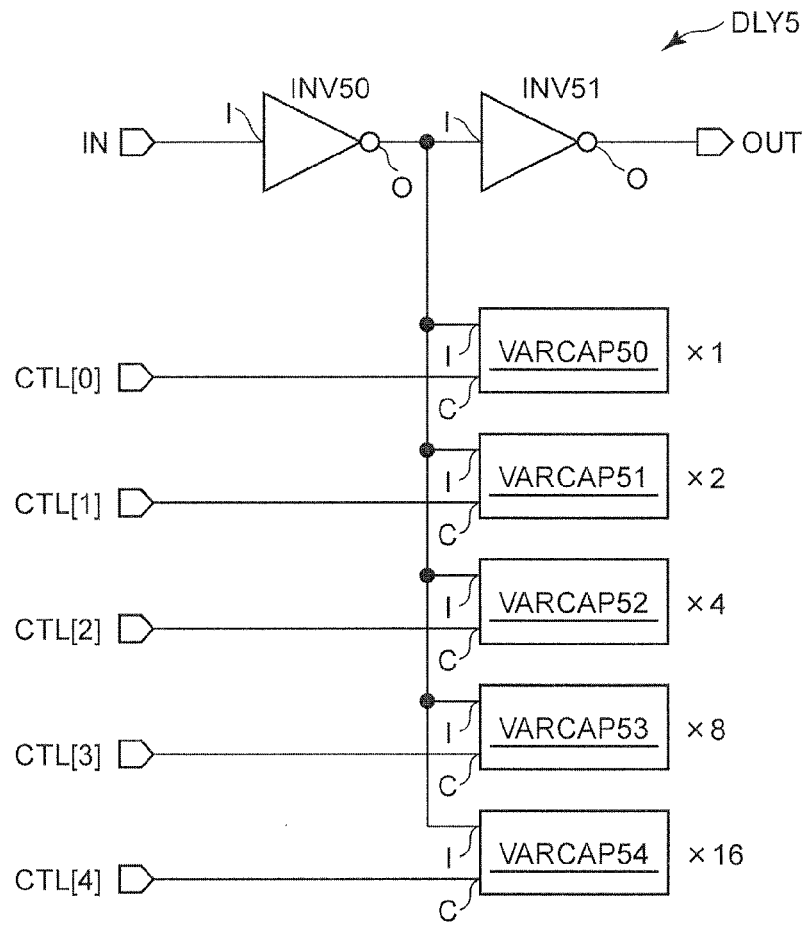
FIG. 9 shows a variable delay element the first embodiment.

A variable delay element DLY5 shown in FIG. 9A includes inverters INV50 and INV51, and capacitor circuits VARCAP50 to VARCAP54. An input terminal I of the inverter INV50 is coupled to an input terminal IN of the variable delay element DLY5. An output terminal O of the inverter INV50 is coupled to an input terminal I of the inverter INV51. An output terminal O of the inverter INV51 is coupled to an output terminal OUT of the variable delay element DLY5. Input terminals I of the capacitor circuits VARCAP50 to VARCAP54 are coupled to a connection node between the inverter INV50 and the inverter INV51. The control terminals C of the capacitor circuits VARCAP 50 to VARCAP54 are coupled to control terminals CTL[0] to CTL[4] of the variable delay element DLY5. A capacitance of the capacitor circuit VARCAP 51 is twice as large as that of the capacitor circuit VARCAP50. A capacitance of the capacitor circuit VARCAP 52 is four times as large as that of the capacitor circuit VARCAP50. A capacitance of the capacitor circuit VARCAP 53 is eight times as large as that of the capacitor circuit VARCAP50. A capacitance of the capacitor circuit VARCAP 54 is sixteen times as large as that of the capacitor circuit VARCAP50.

Figure 9B:
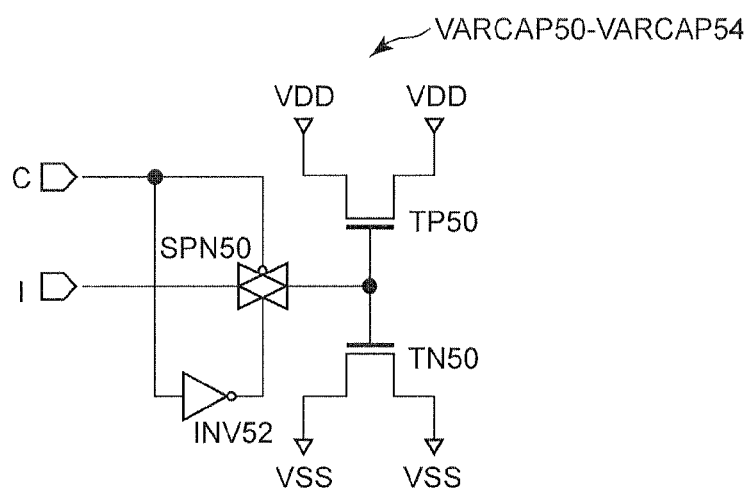

As shown in FIG. 9B, the capacitor circuit VARCAP50 (VARCAP51 to VARCAP54) includes a PMOS transistor TP50, an NMOS transistor TN50, a CMOS switch SPN50, and an inverter INV52. A source and a drain of the PMOS transistor TP50 are coupled to the power supply line VDD. A source and a drain of the NMOS transistor TN50 are coupled to the ground line VSS. A gate of the PMOS transistor TP50 and a gate of the NMOS transistor TN50 are coupled with each other. The CMOS switch SPN50 is coupled between a connection node of the PMOS transistor TP50 and the NMOS transistor TN50 and the input terminal I of the capacitor circuit VARCAP50 (VARCAP51 to VARCAP54). A gate of a PMOS transistor of the CMOS switch SPN50 is coupled to the control terminal C of the capacitor circuit VARCAP50 (VARCAP51 to VARCAP54). A gate of an NMOS transistor of the CMOS switch SPN50 is coupled via the inverter INV52 to the control terminal C of the capacitor VARCAP50 (VARCAP51 to VARCAP54). A delay time of the variable delay element DLY5 shown in FIG. 9A is adjusted by controlling the number of the capacitor circuits in their ON states (a load capacitance of the connection node between the inverters INV50 and INV51) among the capacitor circuits VARCAP50 to VARCAP54.

Figure 10:
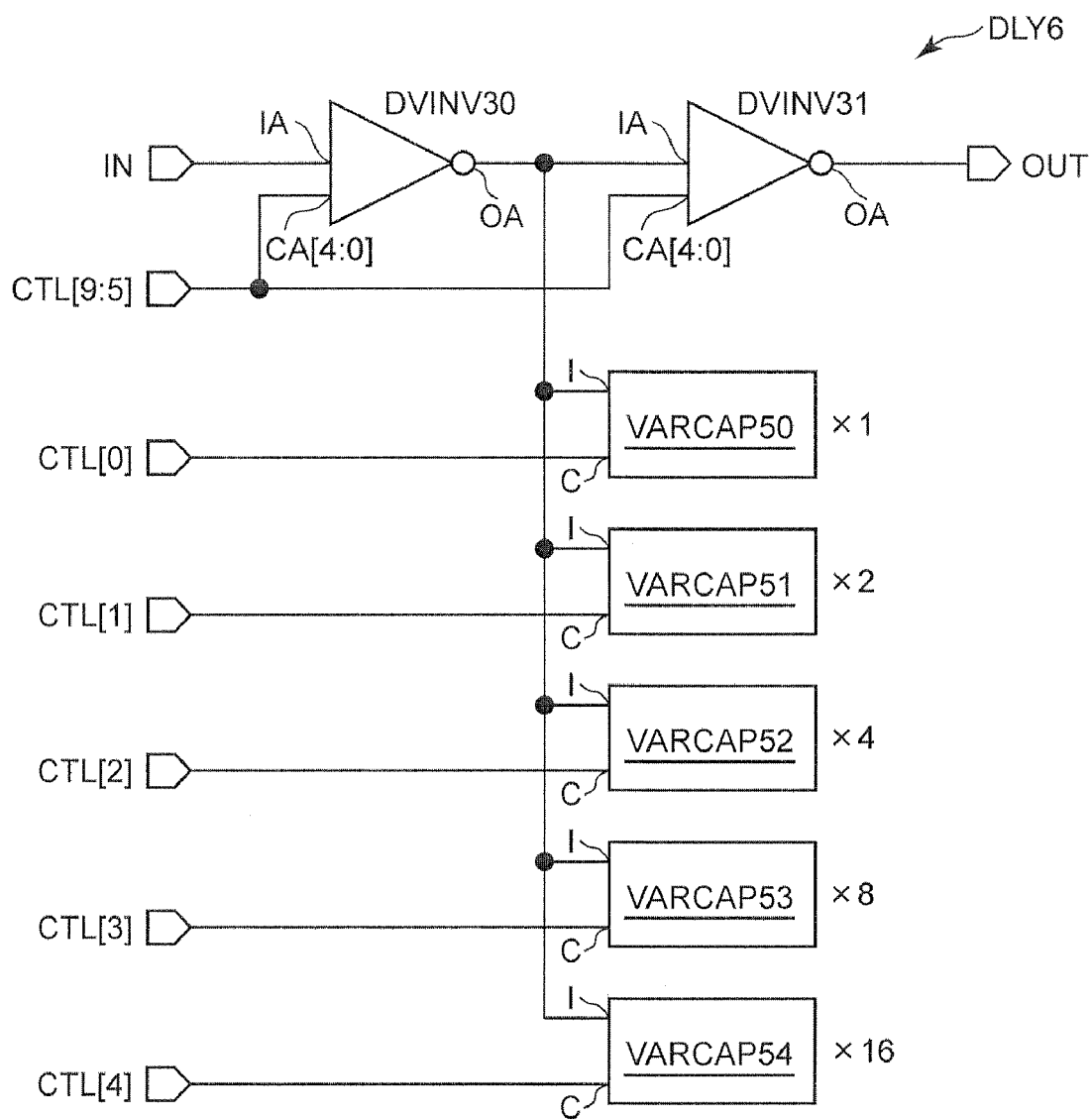
FIG. 10 shows a variable delay element the first embodiment.

A variable delay element DLY6 shown in FIG. 10 is a combination of the drive capability variable inverters DVINV30 and DVINV31 shown in FIG. 7A and the capacitor circuits VARCAP50 to VARCAP54 shown in FIG. 9A. An input terminal IA of the drive capability variable inverter DVINV30 is coupled to an input terminal IN of the variable delay element DLY6. An output terminal OA of the drive capability variable inverter DVINV30 is coupled to an input terminal IA of the drive capability variable inverter DVINV31. An output terminal OA of the drive capability variable inverter DVINV31 is coupled to an output terminal OUT of the variable delay element DLY6. Control terminals CA[4:0] of the drive capability variable inverters DVINV30 and DVINV31 are coupled to control terminals CTL[9:5] of the variable delay element DLY6. Input terminals I of the capacitor circuits VARCAP50 to VARCAP54 are coupled to a connection node between the drive capability variable inverter DVINV30 and the drive capability variable inverter DVINV31. Control terminals C of the capacitor circuits VARCAP50 to VARCAP54 are coupled to control terminals CTL[0] to CTL[4] of the drive capability variable inverter DLY6. A delay time of the variable delay element DLY6, shown in FIG. 10, is adjusted by controlling the number of the inverters having control terminals in their ON states among the inverters having the control terminals SWINV30 to SWINV34 of the drive capability variable inverters DVINV30 and DVINV31 and by controlling the number of the capacitor circuits in their ON states among the capacitor circuits VARCAP50 to VARCAP54.

Figure 11:
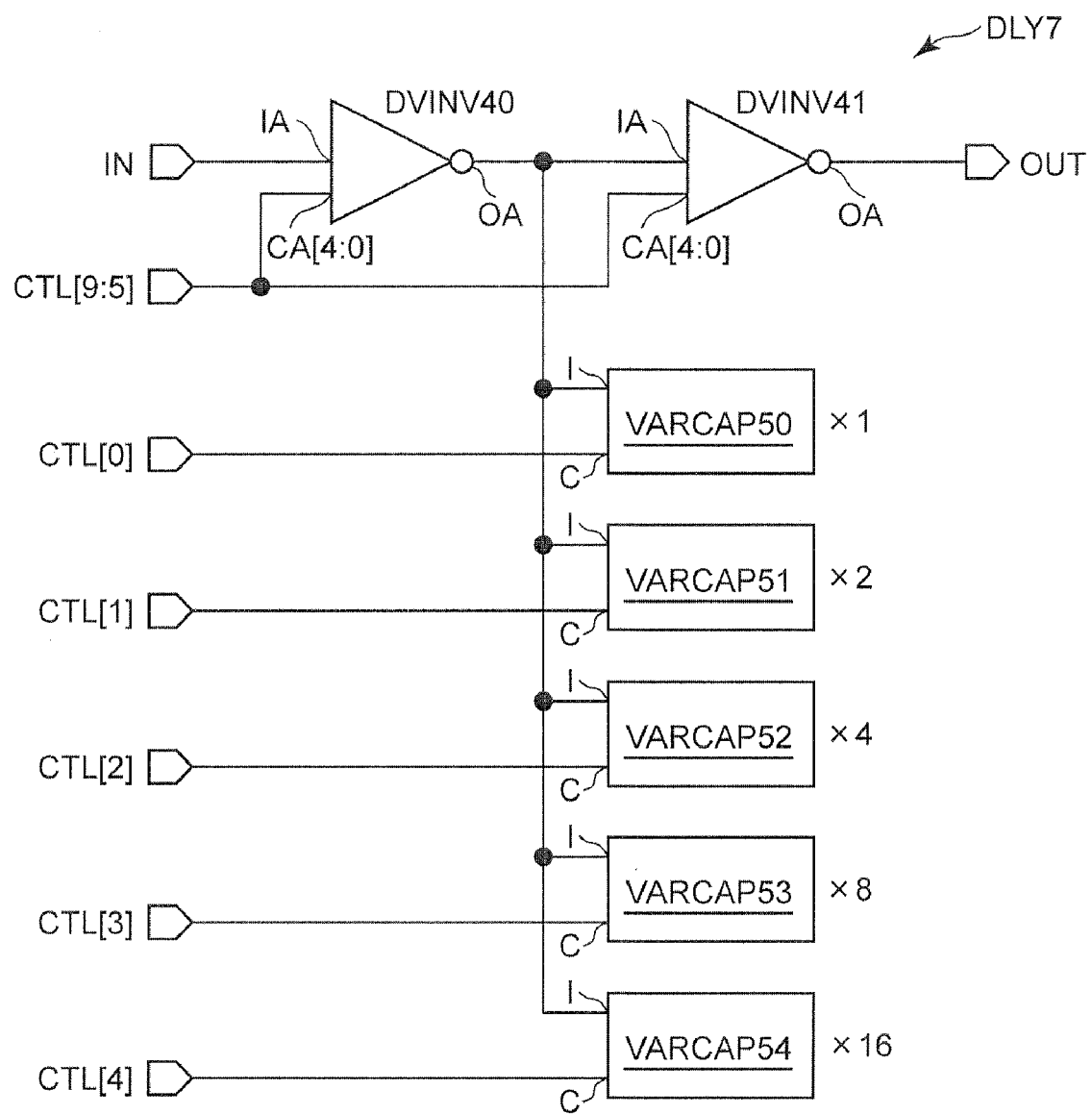
FIG. 11 shows a variable delay element the first embodiment.
Figure 12:
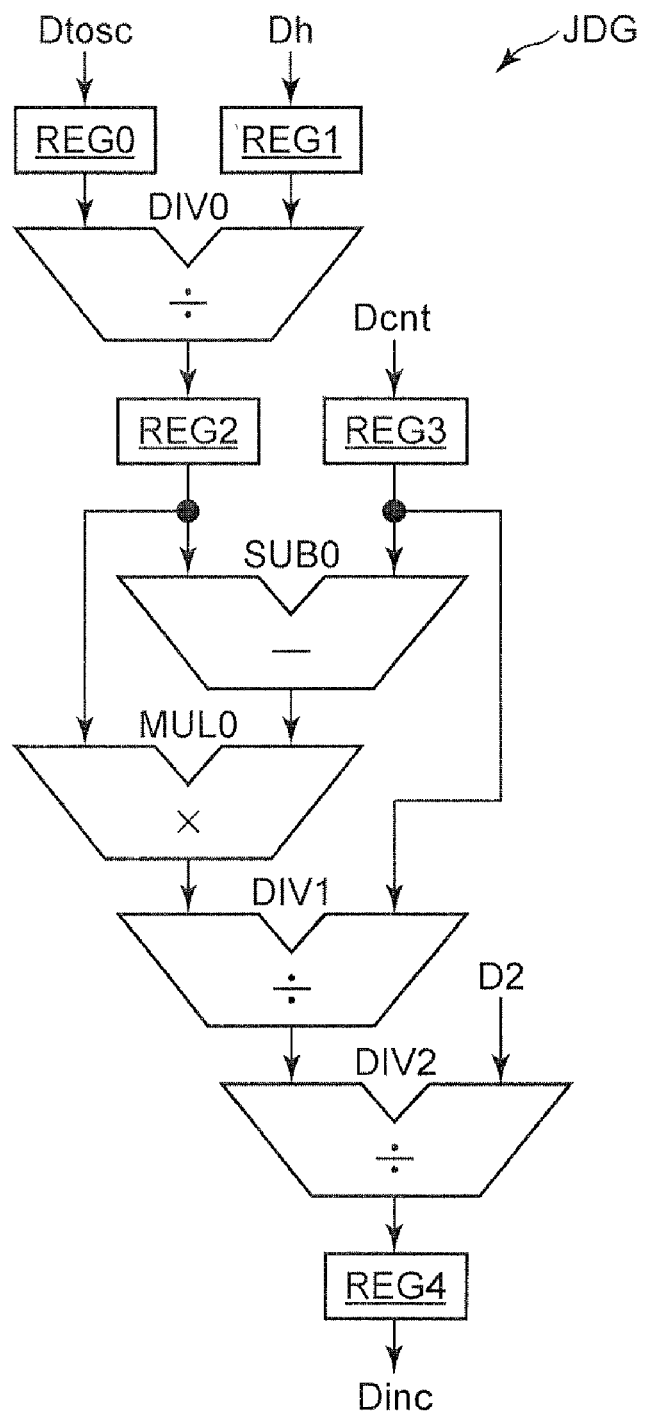
FIG. 12 shows a judgment circuit in the first embodiment.

A variable delay element DLY7, shown in FIG. 11, is a combination of the drive capability variable inverters DVINV40 and DVINV41, shown in FIG. 8A, and the capacitor circuits VARCAP50 to VARCAP54 shown in FIG. 9A. An input terminal IA of the drive capability variable inverter DVINV40 is coupled to an input terminal IN of the variable delay element DLY7. An output terminal OA of the drive capability variable inverter DVINV40 is coupled to an input terminal IA of the drive capability variable inverter DVINV41. An output terminal OA of the drive capability variable inverter DVINV41 is coupled to an output terminal OUT of the drive capability variable element DLY7. Control terminals CA[4:0] of the drive capability variable inverters DVINV40 and DVINV41 are coupled to control terminals CTL[9:5] of the variable delay element DLY7. Input terminals I of the capacitor circuit VARCAP50 to VARCAP54 are coupled to a connection node between the drive capability variable inverter DVINV40 and the drive capability variable inverter DVINV41. Control terminals C of the capacitor circuits VARCAP50 to VARCAP54 are coupled to control terminals CTL[0] to CTL[4] of the drive capability variable inverter DLY7. A delay time of the variable delay element DLY7, shown in FIG. 11, is adjusted by controlling the number of the inverters having control terminals in their ON states among the inverters having the control terminals SWINV40 to SWINV44 of the drive capability variable inverters DVINV40 and DVINV41 and by controlling the number of the capacitor circuits in their ON states among the capacitor circuits VARCAP50 to VARCAP54.

The counter CNT, shown in FIG. 4, receives the output signal of the delay element Hn+1, as a clock signal CLK. The counter CNT counts in synchronization with the clock signal CLK only when a counter control signal CNTEN supplied from the control circuit CTR shown in FIG. 4 is set to "1". The counter CNT initializes all the bits of the counted values to "0" after a predetermined period has elapsed after completion of the counting. The judgment circuit JDG shown in FIG. 4 outputs a digital value Dinc based on the digital values Dtosc and Dh supplied from the control circuit CTR and on a digital value Dcnt supplied from the counter CNT, on completion of the counting by the counter CNT. The digital value Dtosc indicates a cycle of the clock signal CLK. The digital value Dh indicates delay time resolution of the delay elements B0 to Bn, E0 to En, and H0 to Hn+1. The digital value Dcnt indicates the counted value by the counter CNT. The digital value Dinc indicates an increase/decrease value used to correct a delay time of a correction target delay element selected out of the delay elements B0 to Bn, E0 to En, and H0 to Hn+1. An increase/decrease value INC generated by the judgment circuit JDG is represented by an equation (1), where a reference value Ntarg and a counted value N by the counter CNT are used. The reference value Ntarg is represented by an equation (2), where a cycle Tosc of the clock signal CLK and delay time resolution h of the delay elements B0 to Bn, E0 to En, and H0 to Hn+1 are used. A time Ten in which the control circuit CTR sets the counter control signal CNTEN to "1" is represented by an equation (3), where the reference value Ntarg and the cycle Tosc of the clock signal CLK are used.

$$INC = (Ntarg - N) * \{Ntarg/(2*N)\} \quad \text{Equation (1)}$$

$$Ntarg = Tosc/h \quad \text{Equation (2)}$$

$$Ten = Ntarg * Tosc \quad \text{Equation (3)}$$

As shown in FIG. 12, the judgment circuit JDG includes registers REG0 to REG4, dividers DIV0 to DIV2, a subtractor SUB0, and a multiplier MUL0. The register REG0 latches the digital value Dtosc supplied from the control circuit CTR, shown in FIG. 4, at a predetermined cycle. The register 1 loads the digital signal Dh supplied from the control circuit CTR at the predetermined cycle. The divider DIV0 divides a value in the register REG0 by a value in the register REG1. The register REG2 latches a result of the division by the divider DIV0 at a predetermined cycle. The register REG3 latches the digital value Dcnt supplied from the counter CNT, shown in FIG. 4, at a predetermined cycle. The subtractor SUB0 subtracts a value in the register REG3 from a value in the register REG2. The multiplier MUL0 multiplies the value in the register REG2 by a result of the subtraction by the subtractor SUB0. The divider DIV1 divides a result of the multiplication of the multiplier MUL0 by the value in the register REG3. The divider DIV2 divides a result of the division of the divider DIV1 by a digital value D2. The digital value D2 could be, for example, "2". The register REG4 latches a result of the division by the divider DIV2 based on completion of a counting operation by the counter CNT. A value of the register REG4 is output as the digital value Dinc. Note that the register REG4 initializes all the bits to "0" after a predetermined period has elapsed from when the register REG4 latches a result of the division by the divider DIV2.

The divider DIV in FIG. 4 divides the digital value Dinc supplied from the judgment circuit JDG in FIG. 4 by a digital value Dm. The digital value Dm indicates the number of the delay elements H0 to Hn+1. If a selector control signal SELI[0] of the selector control signals SELI[1:0] supplied from the control circuit CTR in FIG. 4 is "1", the selector SINC outputs the digital value Dinc supplied from the judgment circuit JDG. If a selector control signal SELI[1] of the selector control signals SELI[1:0] is "1", the selector SINC outputs a result of the division by the divider DIV.

If an output control signal OUTH (OUTB[0] to OUTB[n], OUTE[0] to OUTE[n]) supplied from the control circuit CTR in FIG. 4 is "0", the increase/decrease value output circuit INCOUT in FIG. 4 outputs a digital value "0" to the adder AH (AB0 to ABn and AE0 to AEn). If the output control signal OUTH (OUTB[0] to OUTB[n], OUTE[0] to OUTE[n]) is "1", the increase/decrease value output circuit INCOUT outputs the digital value supplied from the selector SINC in FIG. 4 to the adder AH (AB0 to Abn, AE0 to AEn). The adder AH (AB0 to Abn, AE0 to AEn) adds the digital value supplied from the increase/decrease value output circuit INCOUT and a value in the register RH (RB0 to RBn, RE0 to REn). The register RH (RB0 to RBn, RE0 to REn) stores a result of the addition by the adder AH (AB0 to ABn and AE0 to AEn) at a predetermined cycle. The control circuit CTR controls each part of the variable delay circuit VARDLY1 via the selector control signals CM0[2:0] to CMn[2:0], SELI[1:0], the ring oscillator control signal ROSCEN, the output control signals OUTH, OUTB[n:0] and OUTE[n:0], the counter control signal CNTEN, and the digital values Dtosc and Dh.

Figure 13:
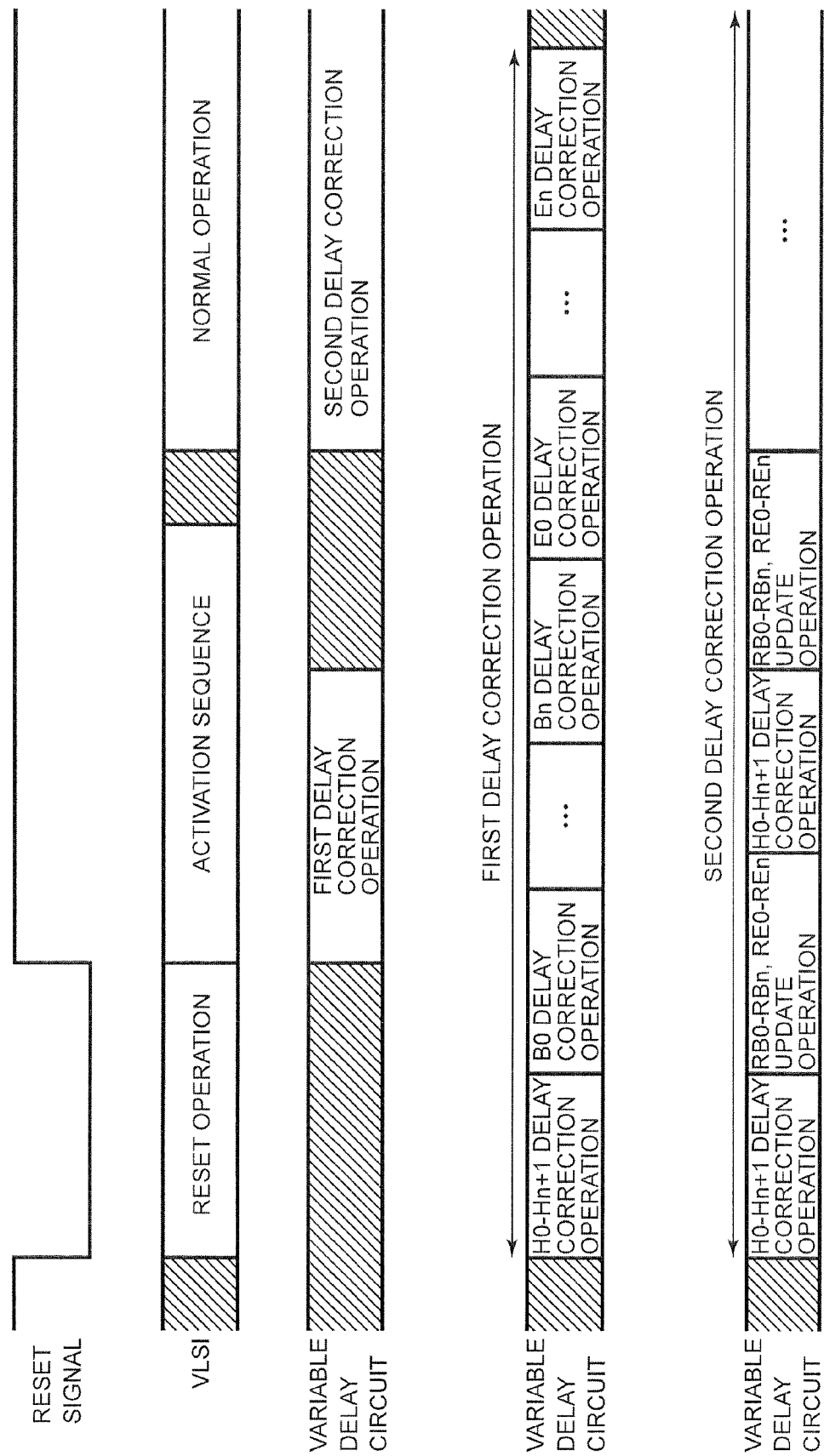
FIG. 13 shows a delay correction operation in the first embodiment.
Figure 14:
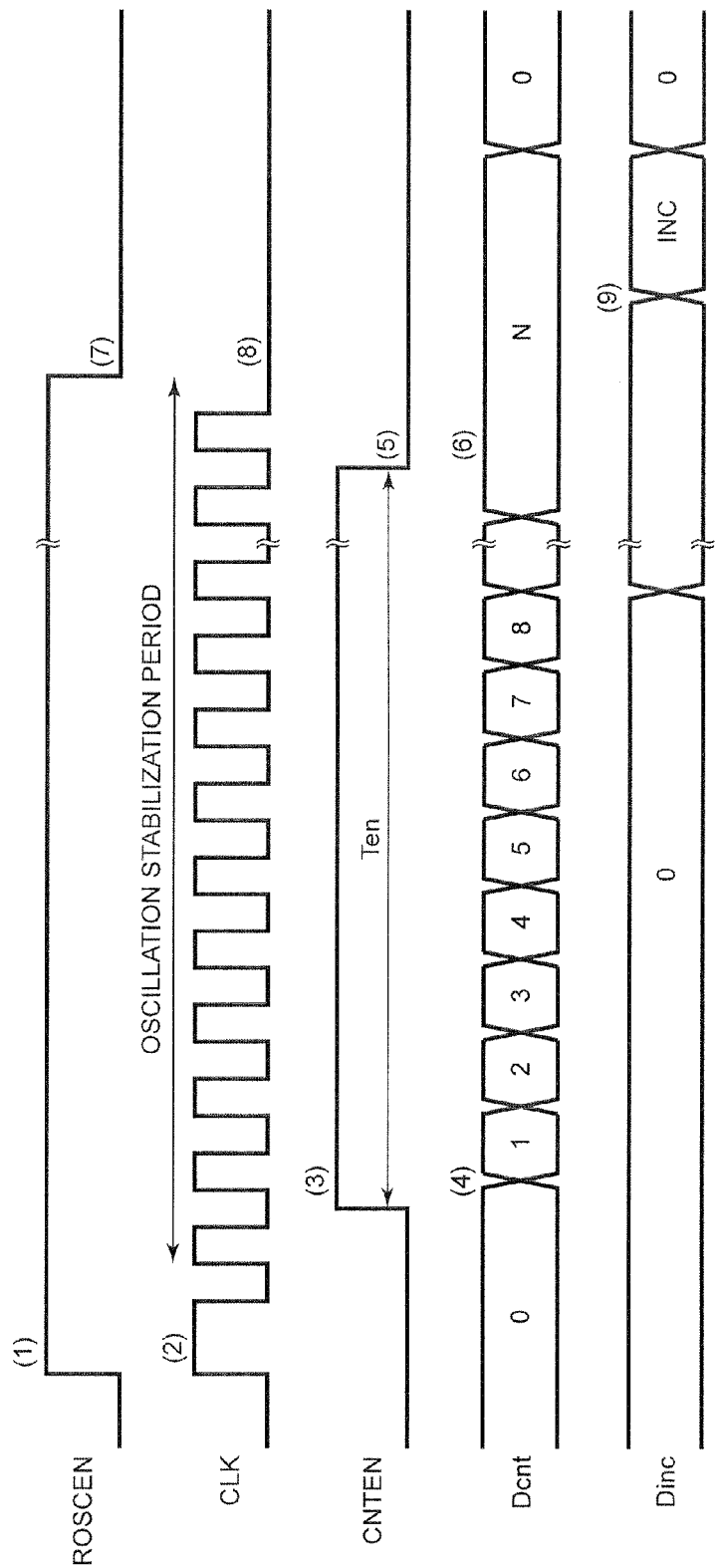
FIG. 14 shows operation timing of the delay correction operation in the first embodiment.

FIG. 13 shows a delay correction operation of the variable delay circuit VARDLY1 in FIG. 4. FIG. 14 shows operation timing in the delay correction operation by the variable delay circuit VARDLY1 in FIG. 4. A reset operation starts when a reset signal changes from "0" to "1" and successively n start-up sequence successively starts when a reset signal changes from "1" to "0", in the VLSI on which the variable delay circuit VARDLY1 is provided. A normal operation starts after a predetermined period has elapsed from completion of the start-up sequence. A first delay correction operation is performed to compensate for the variations in transistor performance among the delay elements B0 to Bn and among the delay elements E0 to En during the start-up sequence of the VLSI, in the variable delay circuit VARDLY1. A second delay correction operation is performed to compensate for variation in transistor performance among the delay elements B0 to Bn and E0 to En due to changes in operating environment, during the normal operation of the VLSI. (The second delay correction operation may be performed at all time.) In the first delay correction operation of the variable delay circuit VARDLY1, delay correction operations are performed in such a sequence as the delay correction operation on the delay elements H0 to Hn+1, the delay correction operation on the delay element B0 to the delay correction operation on the delay element Bn, and the delay correction operation on the delay element E0 to the delay correction operation on the delay element En.

The control circuit CTR in FIG. 4 selects all the delay elements of H0 to Hn+1 as the correction target delay element and sets the selector control signals CM0[0] to CMn[0] among the selector control signals CM0[2:0] to CMn[2:0] to "1", in the delay correction operations of the delay elements H0 to Hn+1. A ring oscillator including the gate circuit NAND and the delay elements H0 to Hn+1 is formed based on the above setting. The control circuit CTR in FIG. 4 outputs the digital value Dtosc indicating an oscillation cycle (the cycle of the clock signal CLK) of the ring oscillator including the gate circuit NAND and the delay elements H0 to Hn+1. In addition, the control circuit CTR outputs the digital value Dh indicating the delay time resolution of the delay elements B0 to Bn, E0 to En, and H0 to Hn+1. The control circuit CTR sets the selector control signal SELI[0] of the selector control signals SELI[1:0] to "1" and sets the output control signal OUTH among the output control signals OUTH, OUTB[n:0], and OUTE[n:0] to "1". The control circuit CTR causes the ring oscillator, which includes the gate circuit NAND and the delay elements H0 to Hn+1, to start an oscillating operation (FIG. 14 (2)) by setting the ring oscillator control signal ROSCEN to "1" (FIG. 14 (1)) and, in the above condition. Next, the control circuit CTR sets the counter control signal CNTEN to "1" in accordance with an oscillation stabilization period of the ring oscillator, which includes the gate circuit NAND and the delay elements H0 to Hn+1, (FIG. 14 (3)) and causes the counter CNT in FIG. 4 to start the counting operations (FIG. 14 (4)). The control circuit CTR sets the counter control signal CNTEN to "0" after a time Ten, which is calculated by use of the oscillation cycle of the ring oscillator including the gate circuit NAND and the delay elements H0 to Hn+1 and of the delay time resolution of the delay circuits B0 to Bn, E0 to En, and H0 to Hn+1, has elapsed (FIG. 14 (5)) and the control circuit CTR terminates the counting operation by the counter CNT (FIG. 14 (6)). Then the control circuit CTR sets the ring oscillator control signal ROSCEN to "0" (FIG. 14 (7)) and terminates the oscillating operation of the ring oscillator including the gate circuit NAND and the delay elements H0 to Hn+1 (FIG. 14 (8)). The judgment circuit JDG in FIG. 4 calculates the increase/decrease value INC based on the completion of the counting operation by the counter CNT (FIG. 14 (9)). By adding a result of division of the digital value Dinc, which indicates the increase/decrease value INC, and the digital value Dm, to the value in the register RH, the delay times of the delay elements H0 to Hn+1 are corrected. The control circuit CTR repeats a series of such operations and terminates the series of operations at some point in which the increase/decrease value INC calculated by the judgment circuit JDG becomes "0" in a predetermined number of times.

The control circuit CTR in FIG. 4 selects the delay element B0 (B1 to Bn) as the correction target delay element and sets the selector control signal CM0[1] (CM1[1] to CMn[1]) among the selector control signals CM0[2:0] (CM1[2:0] to CMn[2:0]) to "1", in the delay correction operation of the delay element B0 (B1 to Bn). A ring oscillator that includes the gate circuit NAND and the delay elements H0 to Hn+1 and B0 (B1 to Bn) is formed based on the above setting. The control circuit CTR outputs the digital value Dtosc which is an oscillation cycle (the cycle of the clock signal CLK) of the ring oscillator including the gate circuit NAND and the delay elements H0 to Hn+1 and B0 (B1 to Bn). The control circuit CTR sets the selector control signal SELI[0] of the selector control signals SELI[1:0] to "0" and sets the output control signal OUTB[0] (OUTB[1] to OUTB[n]) among the output control signals OUTH, OUTB[n:0], and OUTE[n:0] to "1". The control circuit CTR causes the ring oscillator, which includes the gate circuit NAND and the delay elements H0 to Hn+1, and B0 (B1 to Bn), to start an oscillating operation by setting the ring oscillator control signal ROSCEN to "1", in the above condition. Next, the control circuit CTR sets the counter control signal CNTEN to "1" in accordance with an oscillation stabilization period of the ring oscillator, which includes the gate circuit NAND and the delay elements H0 to Hn+1 and B0 (B1 to Bn), and causes the counter CNT to start the counting operation. The control circuit CTR sets the counter control signal CNTEN to "0" after a time Ten, which is calculated by use of the oscillation cycle of the ring oscillator including the gate circuit NAND and the delay elements H0 to Hn+1 and B0 (B1 to Bn) and the delay time resolution of the delay circuit B0 to Bn, E0 to En, and H0 to Hn+1, has elapsed and the control circuit CTR terminates the counting operation by the counter CNT. Then the control circuit CTR sets the ring oscillator control signal ROSCEN to "0" and terminates the oscillating operation of the ring oscillator including the gate circuit NAND and the delay elements H0 to Hn+1 and B0 (B1 to Bn). The judgment circuit JDG in FIG. 4 calculates the increase/decrease value INC, based on the completion of the counting operation by the counter CNT. By adding the digital value Dinc, which indicates the increase/decrease value INC, to the value in the register RB0 (RB1 to RBn), the delay time of the delay element B0 (B1 to Bn) is corrected. The control circuit CTR repeats a series of such operations and terminates the series of operations at some point in which the increase/decrease value INC calculated by the judgment circuit JDG becomes "0" in a predetermined number of times.

The control circuit CTR in FIG. 4 selects the delay element E0 (E1 to En) as the correction target delay element and sets the selector control signal CM0[2] (CM1[2] to CMn[2]) among the selector control signals CM0[2:0] (CM1[2:0] to CMn[2:0]) to "1", in the delay correction operation of the delay element E0 (E1 to En). A ring oscillator that includes the gate circuit NAND and the delay elements H0 to Hn+1 and E0 (E1 to En) is formed, based on the above setting. The control circuit CTR outputs the digital value Dtosc which is an oscillation cycle (the cycle of the clock signal CLK) of the ring oscillator including the gate circuit NAND and the delay elements H0 to Hn+1 and E0 (E1 to En). The control circuit CTR sets the selector control signal SELI[0] of the selector control signals SELI[1:0] to "0" and sets the output control signal OUTE[0] (OUTE[1] to OUTE[n]) among the output control signals OUTH, OUTB[n:0], and OUTE[n:0] to "1". The control circuit CTR causes the ring oscillator, which includes the gate circuit NAND and the delay elements H0 to Hn+1, and E0 (E1 to En), to start an oscillating operation by setting the ring oscillator control signal ROSCEN to "1", in the above condition. Next, the control circuit CTR sets the counter control signal CNTEN to "1" in accordance with an oscillation stabilization period of the ring oscillator, which includes the gate circuit NAND and the delay elements H0 to Hn+1 and E0 (E1 to En), and causes the counter CNT to start the counting operation. The control circuit CTR sets the counter control signal CNTEN to "0" after a time Ten, which is calculated by use of the oscillation cycle of the ring oscillator including the gate circuit NAND and the delay elements H0 to Hn+1 and E0 (E1 to En) and the delay time resolution of the delay circuit B0 to Bn, E0 to En and H0 to Hn+1, has elapsed and the control circuit CTR terminates the counting operation by the counter CNT. Then the control circuit CTR sets the ring oscillator control signal ROSCEN to "0" and terminates the oscillating operation of the ring oscillator including the gate circuit NAND and the delay elements H0 to Hn+1 and E0 (E1 to En). The judgment circuit JDG in FIG. 4 calculates the increase/decrease value INC, based on the completion of the counting operation by the counter CNT. By adding the digital value Dinc, which indicates the increase/decrease value INC, to the value in the register RE0 (RE1 to REn), the delay time of the delay element E0 (E1 to En) is corrected. The control circuit CTR repeats a series of such operations and terminates the series of operations at some point in which the increase/decrease value INC calculated by the judgment circuit JDG becomes "0" in a predetermined number of times.

The correction operations of the delay elements H0 to Hn+1 and update operations of the register RB0 to RBn and RE0 to REn are repeatedly performed, in the second delay correction operation of the variable delay circuit VARDLY1 in FIG. 4. The control circuit CTR in FIG. 4 sets the output signal OUTB[0] to OUTB[n] and OUTE[0] to OUTE[n] to "1", in the update operations of the register RB0 to RBn and RE0 to REn. The digital value added to the value in the register RH is added to the values in the register RB0 to RBn and RE0 to REn, with the above setting, during the delay correction operations of the delay elements H0 to Hn+1. By the above addition, the delay times of the delay elements B0 to Bn and E0 to En are corrected.

In the first embodiment, the first delay correction operation performed in the start-up sequence of the VLSI, on which the variable delay circuit VARDLY1 in FIG. 4 is provided, compensates for the variations in transistor performance among the delay elements B0 to Bn and among the delay elements E0 to En. The second delay correction operation performed in the normal operation of the VLSI, on which the variable delay circuit VARDLY1 is provided (the second delay correction operation may be performed all the time), compensates for the variation in transistor performance of the delay elements B0 to Bn and E0 to En due to the changes in the operating environment of the VLSI (such as the temperature and the power supply voltage). The first delay compensation operation and the second delay compensation operation greatly improve the delay time precision of the variable delay circuit VARDLY1.

The variable delay circuit according to the first embodiment compensates for the variations in transistor performance among the plurality of delay elements and for the variation in transistor performance among the plurality of delay elements due to the changes in the operating environment. For the above reason, the first embodiment may greatly improve the delay time precision of the variable delay circuit.

Figure 15:
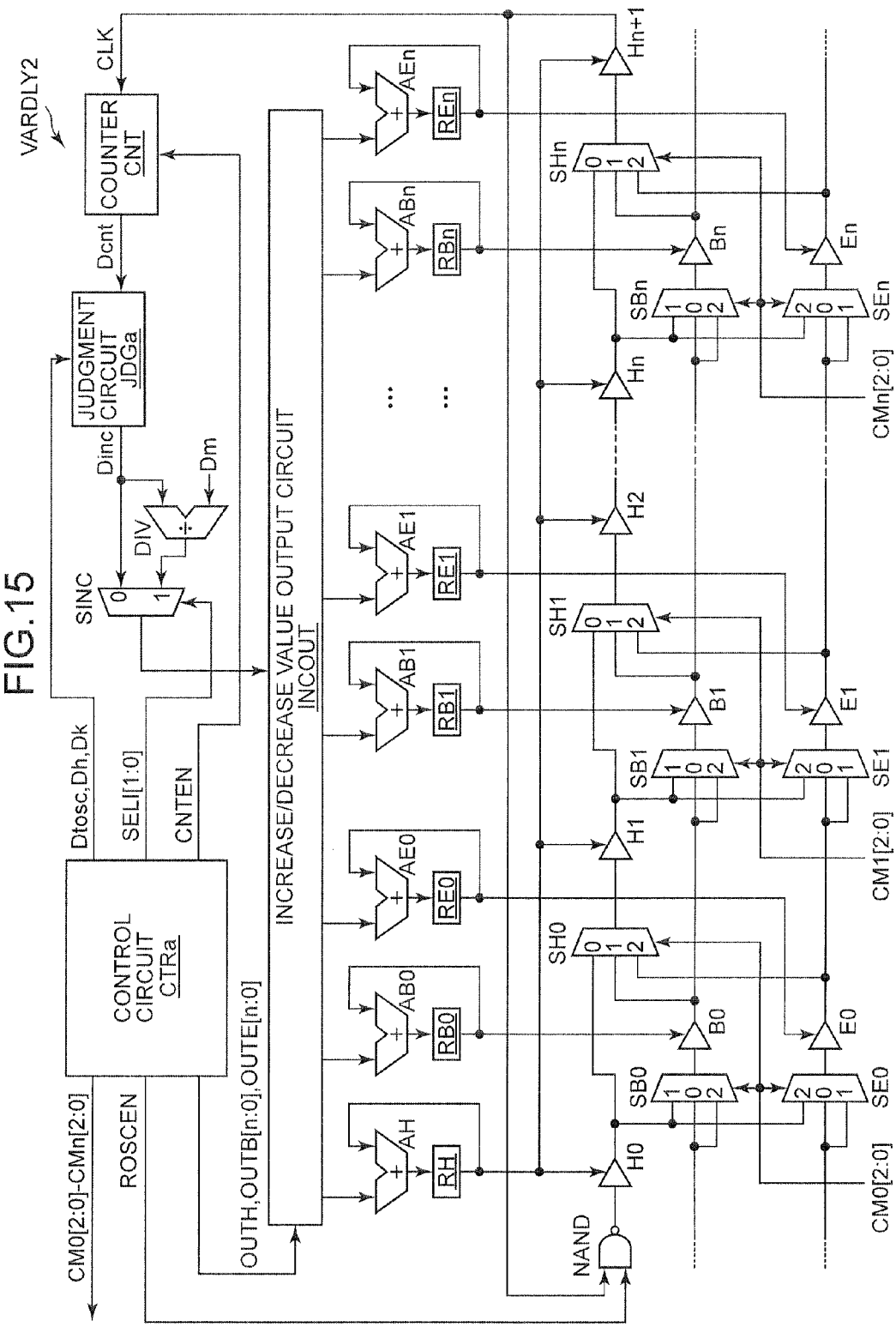
FIG. 15 shows a second embodiment.
Figure 16:
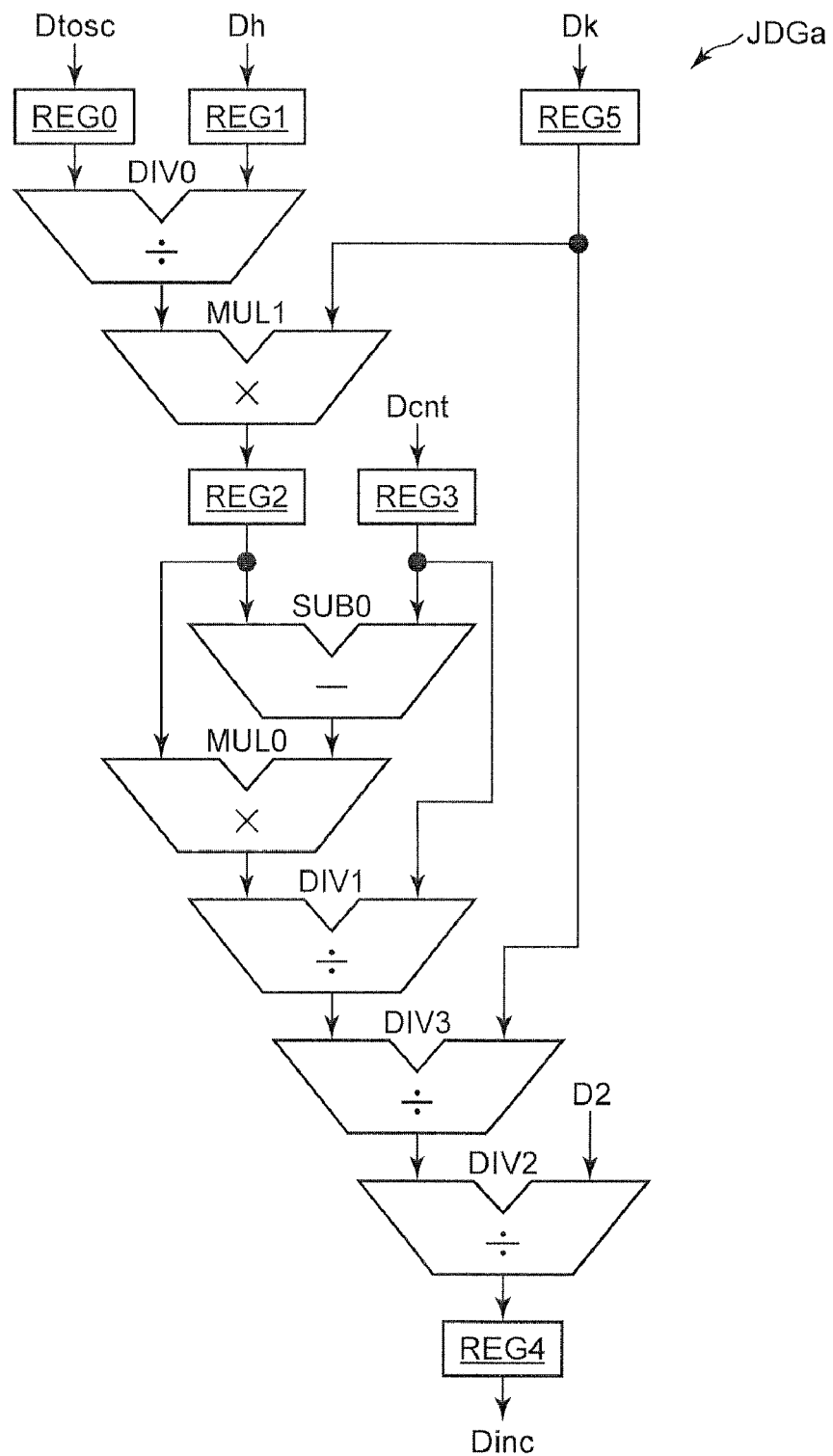
FIG. 16 shows a judgment circuit in the second embodiment.

FIG. 15 shows a second embodiment. FIG. 16 shows a judgment circuit in FIG. 15. The same numerical references are given to the same elements as those shown in the first embodiment and their description will be reduced or omitted. A control circuit CTRa and a judgment circuit JDGa in the variable delay circuit VARDLY2 provided on a VLSI in the second embodiment correspond to the control circuit CTR and the judgment circuit JDG in the variable delay circuit VARDLY1 in the first embodiment.

The control circuit CTRa is the same as the control circuit CTR in the first embodiment other than that a time to set a counter control signal CNTEN to "1" is "k" times lengthened (the "k" is equal to or greater than 10000) and that the control circuit CTRa outputs a digital signal Dk which indicates the constant k. Upon completion of a counting operation by a counter CNT, the judgment circuit JDGa outputs a digital value Dinc based on digital values Dtosc, Dh, and Dk supplied from the control circuit CTRa and a digital signal Dcnt supplied from the counter CNT. An increase/decrease value INC calculated by the judgment circuit JDGa is represented by an equation (4), where a reference value Ntarg', a counted value N' by the counter CNT, and the constant k are used. The reference value Ntarg' is represented by an equation (5), where a cycle Tosc of a clock signal CLK, delay time resolution h of delay elements B0 to Bn, E0 to En and H0 to Hn+1, and the constant k are used. A time Ten' in which the control circuit CTRa sets the counter control signal CNTEN to "1" is represented by an equation (6), where the reference value Ntarg' and the cycle Tosc of the clock signal CLK are used.

$$INC = (Ntarg' - N') * \{Ntarg'/(2*k*N')\} \qquad \text{equation (4)}$$

$$Ntarg' = k*Tosc/h \qquad \text{equation (5)}$$

$$Ten' = Ntarg'*Tosc \qquad \text{equation (6)}$$

As shown in FIG. 16, the judgment circuit JDGa has a configuration in which a register REG5, a multiplier MUL1, and a divider DIV3 are added to the judgment circuit JDG in the first embodiment. The register REG5 latches the digital value Dk supplied from the control circuit CTRa in FIG. 15 at a predetermined cycle. The multiplier MUL1 multiplies a result of division by divider DIV0 by a value in the register REG5. A register REG2 does not latch the result of the division by the divider DIV0 but latches the result of the multiplication by the multiplier MUL1 at the predetermined cycle. The divider DIV3 divides the result of the division by divider DIV1 by the value in the register REG5. Divider DIV2 does not divide the result of the division by the divider DIV1 but divides the result of the division by the divider DIV3 by a digital value D2.

In the second embodiment, an error in time in which the control circuit CTRa sets the counter control signal CNTEN to "1" in accordance with variation in power supply voltage of the VLSI including the variable delay circuit VARDLY2 may be observed. As disclosed above, in view of degradation in delay time precision of the variable delay circuit VARDLY2 due to the error in the counted value by the counter CNT, the time in which the control circuit CRTa sets the counter signal CNTEN to "1" is "K" times lengthened. The setting corrects the error in the counted value by the counter CNT to an average. The delay time precision of the variable delay circuit VARDLY2 may be improved.

Figure 17:
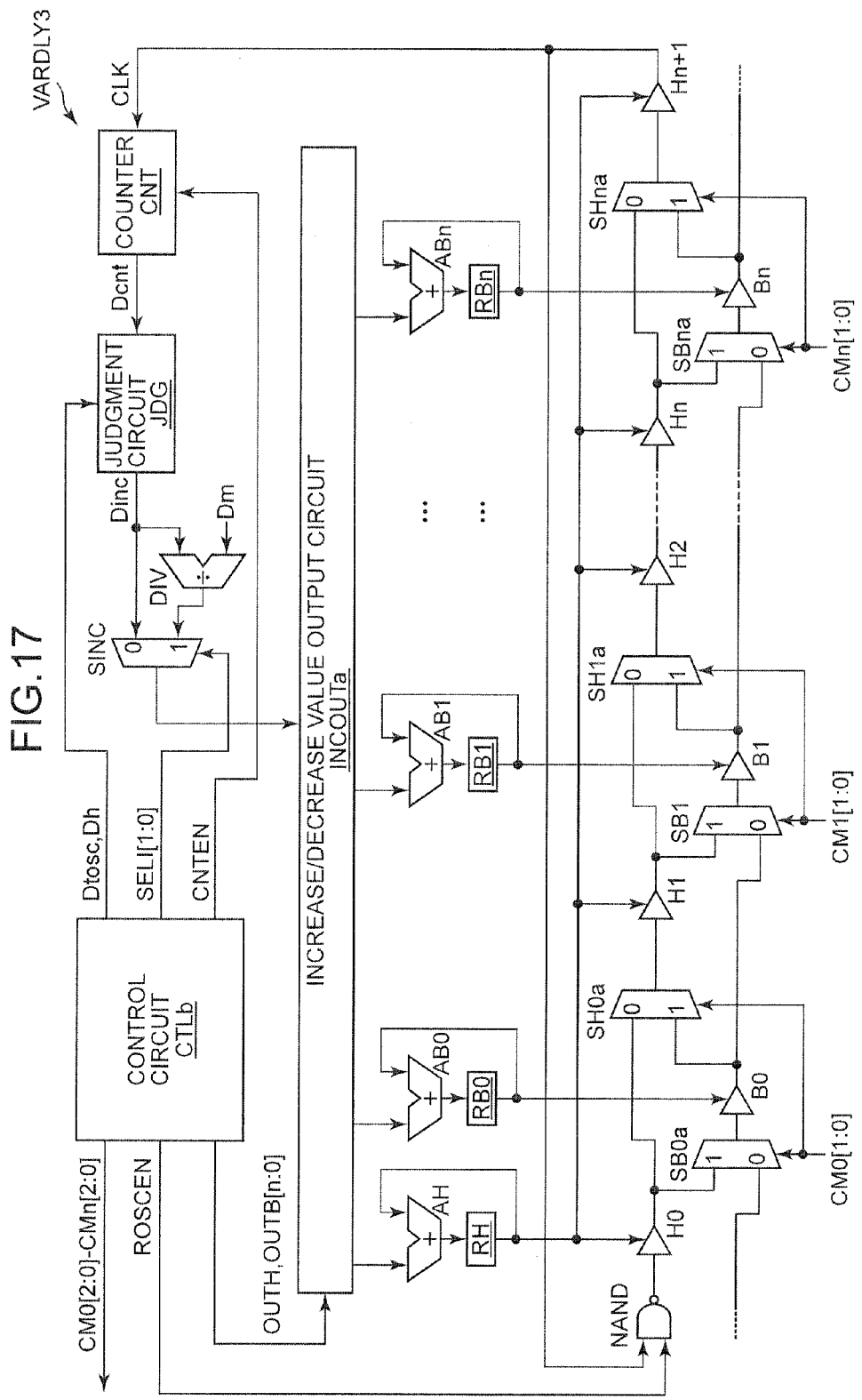
FIG. 17 shows a third embodiment.

FIG. 17 shows a third embodiment. The same numerical references are given to the same elements as those shown in the first embodiment and their description will be reduced or omitted. A variable delay circuit VARDLY3 provided on a VLSI in a third embodiment includes selectors SB0a to SBna, SH0a to SHna and SINC, delay elements B0 to Bn and H0 to Hn+1, a gate circuit NAND, a counter CNT, a judgment circuit JDG, a divider DIV, an increase/decrease value output circuit INCOUTa, adders AB0 to ABn and AH, registers RB0 to RBn and RH, and a control circuit CTRb. The variable delay circuit VARDLY3 includes delay elements B0 to Bn which are coupled in series and whose start point is an input terminal, and selectors which select any of the output signals from the delay elements B0 to Bn and supplies the output signal to an output terminal.

If a selector control signal CM0[0] of selector control signals CM0[1:0] is "1", the selector SB0a outputs a signal supplied from the input terminal of the variable delay circuit VERDLY3. If a selector control signal CM0[1] of the selector control signals CM0[1:0] is "1", the selector SB0a outputs an output signal of the delay element H0. If a selector control signal CM1[0] (CM2[0] to CMn[0]) of selector control signals CM1[1:0] (CM2[1:0] to CMn[1:0]) is "1", the selector SB1a (SB2a to SBna) outputs an output signal of the delay element B0 (B1 to Bn−1). If a selector control signal CM1[1] (CM2[1] to CMn[1]) of the selector control signals CM1[1:0] (CM2[1:0] to CMn[1:0]) is "1", the selector SB1a (SB2a to SBna) outputs an output signal of the delay element H1 (H2 to Hn).

If the selector control signal CM0[0] (CM1[0] to CMn[0]) of the selector control signals CM0[1:0] (CM1[1:0] to CMn [1:0]) is "1", the selector SH0a (SH1a to SHna) outputs the output signal of the delay element H0 (H1 to Hn). If the selector control signal CM0[1] (CM1[1] to CMn[1]) of the selector control signals CM0[1:0] (CM1[1:0] to CMn[1:0]) is "1", the selector SH0a (SH1a to SHna) outputs the output signal of the delay element B0 (B1 to Bn).

The increase/decrease value output circuit INCOUTa does not include a circuit which outputs a digital value to the adders AE0 to AEn of the increase/decrease value output circuit INCOUT in FIG. 4. The control circuit CTRb does not include a circuit performing delay correction operations of the delay elements E0 to En that is a first delay correction operation and a circuit performing update operations of the register RE0 to REn that is a second delay correction operation, both of which are included in the control circuit CTR in FIG. 4. The third embodiment having the configuration disclosed above has the same advantages as that of the first embodiment.

Figure 18:
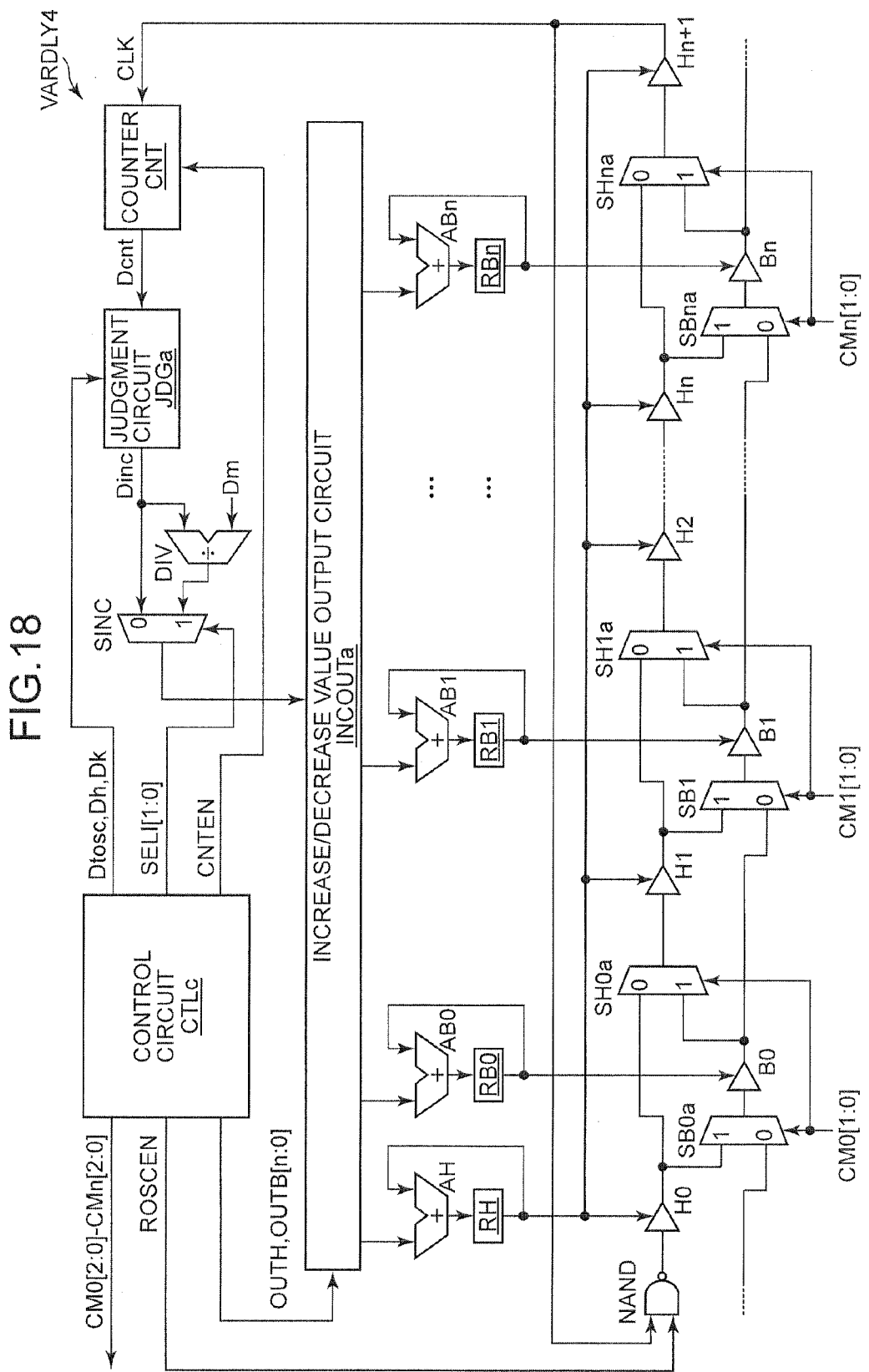
FIG. 18 shows a fourth embodiment.

FIG. 18 shows a fourth embodiment. The same numerical references are given to the same elements as those shown in the first to the third embodiments and their descriptions will be reduced or omitted. A control circuit CTRc and a judgment circuit JDGa in a variable delay circuit VARDLY4 provided on a VLSI in the fourth embodiment correspond to the control circuit CTRb and the judgment circuit JDG in the variable delay circuit VARDLY3 shown in FIG. 17. The control circuit CTRc is a modification of the control circuit CTRb, just as the control circuit CTRa, in FIG. 15, is a modification of the control circuit CTR in FIG. 4. The fourth embodiment has the same advantages as those of the first and the second embodiments.

Example embodiments of the present invention have now been described in accordance with the above advantages. It will be appreciated that these examples are merely illustrative of the invention. Many variations and modifications will be apparent to those skilled in the art.

The invention claimed is:

1. A variable delay circuit comprising:
   a plurality of delay elements; and
   a delay time correction circuit having a plurality of correction circuits provided for each of the plurality of delay elements,
   wherein each of the plurality of correction circuits corrects a delay time in a corresponding delay element among the plurality of delay elements to compensate for a variation in transistor performance among the plurality of delay elements, and
   wherein the delay time correction circuit includes:
      a plurality of delay elements for oscillation;
      a correction target selection circuit that selects a correction target delay element out of the plurality of delay elements for oscillation and the plurality of delay elements;
      a path forming circuit that forms a ring oscillation circuit including the correction target delay element;
      a counter that counts an oscillation signal from the ring oscillation circuit; and
      a delay adjustment circuit that adjusts the delay time of the correction target delay element, based on a reference value and a counted value by the counter.

2. The variable delay circuit according to claim 1, wherein the delay time correction circuit uniformly corrects the delay time for the plurality of delay elements to compensate for variation in transistor performance among the plurality of delay elements.

3. The variable delay circuit according to claim 1, further comprising:
   a register that stores a signal indicating a correction value set based on the reference value and the counted value by the counter.

4. The variable delay circuit according to claim 1, wherein the correction target selection circuit selects the delay element as the correction target delay element after selecting all the plurality of delay elements for oscillation.

5. The variable delay circuit according to claim 1, wherein when the correction target selection circuit selects the delay element for oscillation, the path forming circuit forms the ring oscillation circuit with the selected delay element for oscillation, and when the correction target selection circuit selects the delay element, the path forming circuit forms the ring oscillation circuit with the delay element for oscillation and the selected delay element.

6. The variable delay circuit according to claim 1, wherein the correction target selection circuit repeatedly selects the delay element for oscillation, and the delay adjustment circuit adjusts the delay time of the correction target delay element, based upon a difference between the reference value and the counted value.

7. The variable delay circuit according to claim 1, wherein the reference value is set based upon an oscillation cycle of the ring oscillation circuit and on a delay time resolution of the correction target delay element.

8. The variable delay circuit according to claim 1, wherein the reference value is set based upon a result of multiplication of a predetermined coefficient, which is an integer equal to or greater than 2, and a result of division of an oscillation cycle of the ring oscillation circuit and a delay time resolution of the correction target delay element.

9. The variable delay circuit according to claim 1, wherein the counter counts the oscillation signal during a count permission time set based on the reference value and an oscillation cycle of the ring oscillation circuit.

10. The variable delay circuit according to claim 9, wherein the count permission time is multiplied by k, where k is equal to or greater than 10000.

11. The variable delay circuit according to claim 1, wherein the delay time adjustment of the correction target delay element is completed in response to a difference between the reference value and the counted value becoming 0.

12. The variable delay circuit according to claim 1, wherein the plurality of delay elements includes a first delay element and a second delay element each having a different ideal delay time.

13. The variable delay circuit according to claim 1, wherein the plurality of delay elements have a same ideal delay time.

14. The variable delay circuit according to claim 1, wherein the plurality of delay elements include a plurality of transistors having different sizes and the delay time is corrected by selecting at least one transistor out of the plurality of transistors.

15. The variable delay circuit according to claim 1, wherein the plurality of delay elements include a plurality of capacitor circuits having different capacitances and the delay time is corrected by selecting at least one capacitor circuit out of the plurality of capacitor circuits.

16. The variable delay circuit according to claim 1, wherein the delay time correction circuit corrects the delay time on the plurality of delay elements upon activating a semiconductor integrated circuit including the variable delay circuit.

17. A method of delay correction comprising:
selecting a first correction target delay element out of a plurality of delay elements for oscillation;
selecting a second correction target delay element out of a plurality of delay elements;
forming a first ring oscillation circuit including the first correction target delay element and not including the second correction target delay element;
correcting a delay time of the first correction target delay element based upon an oscillation frequency of the first ring oscillation circuit and on a delay time resolution of the first correction target delay element;
forming a second ring oscillation circuit including the first correction target delay element and the second correction target delay element; and
correcting a delay time of the second target delay element based upon an oscillation frequency of the second ring oscillation circuit and on a delay time resolution of the second correction target delay element.

18. The method of delay correction according to claim 17, wherein the first correction target delay element is a plurality of delay elements for oscillation.

19. The method of delay correction according to claim 17, wherein the correcting of the delay time is performed based on a difference between the oscillation frequency and a reference value set on a basis of the oscillation frequency and of the delay time resolution.

* * * * *